(12) United States Patent
Chartrand et al.

(10) Patent No.: US 11,674,998 B2
(45) Date of Patent: Jun. 13, 2023

(54) HOUSING WITH ANTI-DISLODGE CAPABILITY

(71) Applicant: Johnstech International Corporation, Minneapolis, MN (US)

(72) Inventors: Bob Chartrand, Wakefield, RI (US); David Johnson, Wayzata, MN (US); Brian Sheposh, Minneapolis, MN (US); Mike Andres, Inver Grove Heights, MN (US)

(73) Assignee: Johnstech International Corporation, Minneapolis, MN (US)

( * ) Notice: Subject to any disclaimer, the term of this patent is extended or adjusted under 35 U.S.C. 154(b) by 0 days.

(21) Appl. No.: 17/492,347

(22) Filed: Oct. 1, 2021

(65) Prior Publication Data

US 2022/0107357 A1 Apr. 7, 2022

Related U.S. Application Data

(60) Provisional application No. 63/086,683, filed on Oct. 2, 2020.

(51) Int. Cl.
*G01R 31/28* (2006.01)

(52) U.S. Cl.
CPC ..... *G01R 31/2887* (2013.01); *G01R 31/2863* (2013.01); *G01R 31/2865* (2013.01)

(58) Field of Classification Search
CPC ............ G01R 31/2653; G01R 31/2884; G01R 31/305; G01R 31/307; G01R 31/311; G01R 31/66
See application file for complete search history.

(56) References Cited

U.S. PATENT DOCUMENTS

| 5,742,171 | A | 4/1998 | Matsunaga et al. |
| 6,854,981 | B2 | 2/2005 | Nelson |
| 7,445,465 | B2 * | 11/2008 | Lopez ................. G01R 1/0466 439/72 |
| 8,354,854 | B2 | 1/2013 | Sherry |
| 9,274,141 | B1 * | 3/2016 | Andres ............. G01R 31/2887 |
| 2019/0097333 | A1 * | 3/2019 | Sherry ............... H01R 12/7076 |

OTHER PUBLICATIONS

International Search Report and Written Opinion; International Patent Application No. PCT/US2021/053213, dated Dec. 29, 2021 (8 pages).

* cited by examiner

*Primary Examiner* — Tung X Nguyen

(74) *Attorney, Agent, or Firm* — Hamre, Schumann, Mueller & Larson, P.C.

(57) ABSTRACT

A contactor assembly for a testing system is disclosed. The assembly includes a contact having a contact tail and a housing having a top surface and a bottom surface. A slot extends through the housing from the top surface to the bottom surface and defines a first inner side wall of the housing and a first inner end wall. The contact is receivable in the slot. The contact tail includes a sloped terminus. A retainer is disposed on the first inner side wall. When the sloped terminus is engaged with the first inner end wall, at least a portion of the retainer overlaps with the contact forming at an overlapping area in a cross-sectional view, thereby preventing removal of the contact from the top side of the housing.

20 Claims, 21 Drawing Sheets

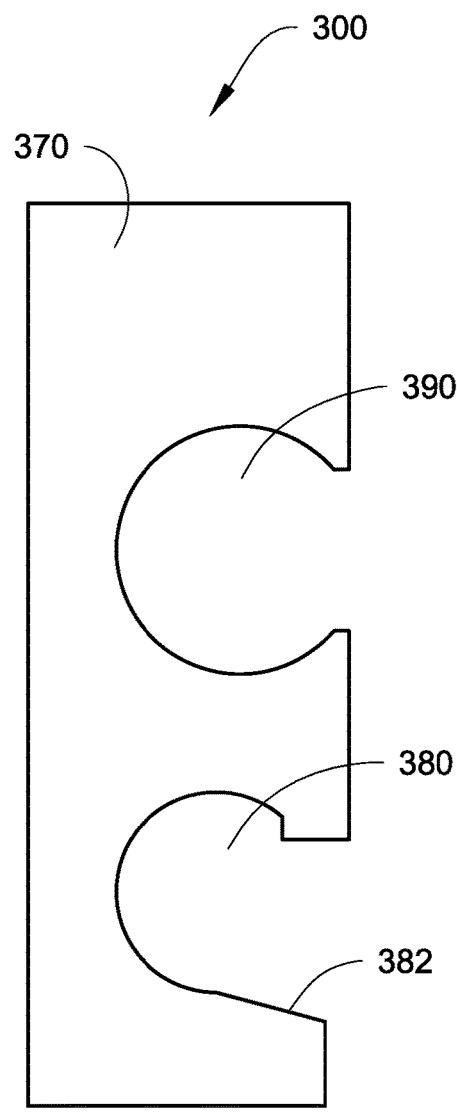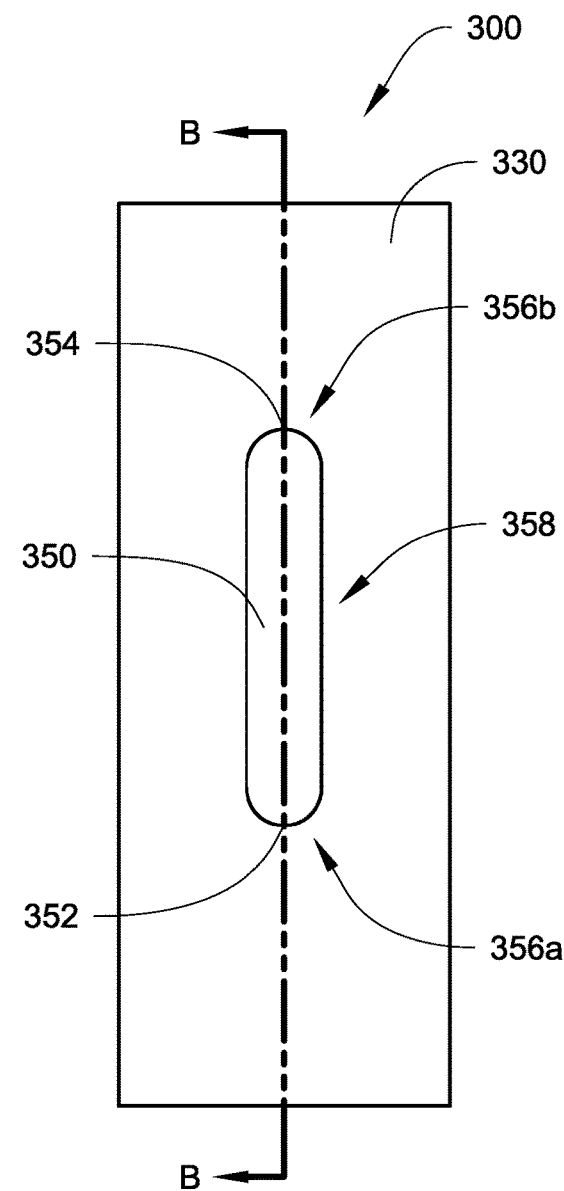

HOUSING WITH ANTI-DISLODGE CAPABILITY

TECHNICAL FIELD

This disclosure relates generally to the field of testing microcircuits (e.g., chips such as semiconductor devices, integrated circuits, etc.). More specifically, the disclosure relates to a contactor assembly having a housing with anti-dislodge capability for contact retention in a testing system.

BACKGROUND

The manufacturing processes for microcircuits cannot guarantee that every microcircuit is fully functional. Dimensions of individual microcircuits are microscopic and process steps very complex, so small or subtle failures in a manufacturing process can often result in defective devices. Mounting a defective microcircuit on a circuit board is relatively costly. Installation usually involves soldering the microcircuit onto the circuit board. Once mounted on a circuit board, removing a microcircuit is problematic because the very act of melting the solder for a second time may ruin the circuit board. Thus, if the microcircuit is defective, the circuit board itself is probably ruined as well, meaning that the entire value added to the circuit board at that point is lost. For all these reasons, a microcircuit is usually tested before installation on a circuit board. Each microcircuit must be tested in a way that identifies all defective devices, but yet does not improperly identify good devices as defective. Either kind of error, if frequent, adds substantial overall cost to the circuit board manufacturing process.

Microcircuit test equipment itself is quite complex. First of all, the test equipment must make accurate and low resistance temporary and non-destructive electrical contact with each of the closely spaced microcircuit contacts. Because of the small size of microcircuit contacts and the spacing between them, even small errors in making the contact will result in incorrect connections. A further problem in microcircuit test equipment arises in automated testing. Testing equipment may test one hundred devices a minute, or even more. The sheer number of tests cause wear on the tester contacts making electrical connections to the microcircuit terminals during testing. This wear dislodges conductive debris from both the tester contacts and the device under test (DUT) terminals that contaminates the testing equipment and the DUTs themselves. The debris eventually results in poor electrical connections during testing and false indications that the DUT is defective. The debris adhering to the microcircuits may result in faulty assembly unless the debris is removed from the microcircuits. Removing debris adds cost and introduces another source of defects in the microcircuits themselves.

Other considerations exist as well. Inexpensive tester contacts that perform well are advantageous. Minimizing the time required to replace them is also desirable, since test equipment is expensive. If the test equipment is off line for extended periods of normal maintenance, the cost of testing an individual microcircuit increases. Test equipment in current use has an array of test contacts that mimic the pattern of the microcircuit terminal array. The array of test contacts is supported in a structure that precisely maintains the alignment of the contacts relative to each other. An alignment board or plate or template aligns the microcircuit itself with the test contacts. The test contacts and the alignment board are mounted on a load board having conductive pads that make electrical connection to the test contacts. The load board pads are connected to circuit paths that carry the signals and power between the test equipment electronics and the test contacts.

Each of the array of test contacts that electrically connect to the microcircuit signal and power (S&P) terminals may be referred to as a contactor assembly that includes a housing and a contact (may also be referred to as a pin) biased by e.g., a pair of elastomers. In one particular application, when the contact is in operation, a flat portion of the contact tail of the contact is against the load board (a printed circuit board "PCB"), and a tail-stop (e.g., an inner end wall) of the housing may keep the contact properly positioned in place. However, when removing the contactor assembly from the load board to service or to maintain the contactor assembly, the contact is likely to rotate counter-clockwise (in a cross-sectional view), or to rotate away from the contact's normal operating position into a position where the contact is vulnerable to falling out of the housing or damaging another device/component. One solution to address the dislodgement issue of the contact is to use an upper cover of the housing of the contactor assembly to hold the contact in position and to prevent the contact from rotating further counterclockwise and thus potentially falling out from the top surface of the housing (it is expected that pin will be removable from the bottom of the housing when the housing is detached from the load board). In such solution, the housing of the contact assembly may be clamping the contact against the elastomers (e.g., made of rubber or other suitable material) to clamp the contact in place. However, for a particular contactor assembly, the housing may be very thin (e.g., about one mm in length), fragile, and not strong. If an upper cover (top) is used to hold the contact down, the housing may lift/bow. In other words, the strength of the housing in the vertical direction (e.g., in a direction from a top surface to a bottom surface of the housing) may not be strong enough to hold the contact in place.

BRIEF SUMMARY

Embodiments disclosed herein provide a solution that addresses each of the above-mentioned problems. Embodiments disclosed herein may provide an anti-dislodge mechanism (e.g., by adding material in the housing in an area that may keep the contact in position) to prevent the contact from rotating further counterclockwise, especially when the contactor assembly is removed from the mounting plate (e.g., the load board). It will be appreciated that the anti-dislodge mechanism provided by embodiments disclosed herein may prevent the contact from rotating and keep the contact in the proper position, when the contactor assembly is mounted to the load board so that the contact may not be standing upwards in the housing (e.g., in a cross-sectional view or side view).

Also disclosed is a contactor assembly for a testing system for testing integrated circuit devices. The contactor assembly includes a contact having a contact head, a contact body, and a contact tail. The contactor assembly also includes a housing having a first planar side surface and a second planar side surface opposite to the first surface. The housing includes a top surface and a bottom surface opposite to the top surface. A slot extends through the housing from the top surface to the bottom surface. The slot defines a first inner side wall of the housing, a second inner side wall of the housing opposite to the first inner side wall, a first inner end wall of the housing, and a second inner end wall of the housing opposite to the first inner end wall. The contact is receivable in the slot. The contact tail includes a flat portion and a sloped terminus. A retainer is disposed on the first inner side wall of the housing. When the sloped terminus of the contact is engaged with the first inner end wall of the housing, at least a portion of the retainer overlaps with the contact forming at an overlapping area in a cross-sectional view, and no clearance exists between the retainer and the contact in at least a portion of the overlapping area.

Also disclosed is a testing system for testing integrated circuit devices. The testing system includes a device under test having at least one terminal and a contactor assembly. The contactor assembly includes a contact having a contact head, a contact body, and a contact tail. The contactor assembly also includes a housing having a first planar side surface and a second planar side surface opposite to the first surface. The housing includes a top surface and a bottom surface opposite to the top surface. A slot extends through the housing from the top surface to the bottom surface. The slot defines a first inner side wall of the housing, a second inner side wall of the housing opposite to the first inner side wall, a first inner end wall of the housing, and a second inner end wall of the housing opposite to the first inner end wall. The contact is receivable in the slot. The contact tail includes a flat portion and a sloped terminus. A retainer is disposed on the first inner side wall of the housing. When the sloped terminus of the contact is engaged with the first inner end wall of the housing, at least a portion of the retainer overlaps with the contact forming at an overlapping area in a cross-sectional view, and no clearance exists between the retainer and the contact in at least a portion of the overlapping area. The at least one terminal of the device under test is configured to engage with the contact head during testing.

Also disclosed is a method of retaining a contact of a contactor assembly in a testing system for testing integrated circuit devices. The method includes engaging a sloped terminus of the contact with a first inner end wall of a housing, forming at an overlapping area between at least a portion of a retainer and the contact in a cross-sectional view, and retaining the contact in place when the contactor assembly is removed from the testing system. The contactor assembly includes the contact having a contact head, a contact body, and a contact tail. The contactor assembly also includes a housing having a first planar side surface and a second planar side surface opposite to the first surface. The housing includes a top surface and a bottom surface opposite to the top surface. A slot extends through the housing from the top surface to the bottom surface. The slot defines a first inner side wall of the housing, a second inner side wall of the housing opposite to the first inner side wall, the first inner end wall of the housing, and a second inner end wall of the housing opposite to the first inner end wall. The contact is receivable in the slot. The contact tail includes a flat portion and the sloped terminus. The retainer is disposed on the first inner side wall of the housing. When the sloped terminus of the contact is engaged with the first inner end wall of the housing, at least a portion of the retainer overlaps with the contact forming at an overlapping area in a cross-sectional view, and no clearance exists between the retainer and the contact in at least a portion of the overlapping area. The at least one terminal of the device under test is configured to engage with the contact head during testing.

In an embodiment, there may be a precision/tight/close fit between the housing and the contact. The retainer may not always be perfectly sized to exactly touch the contact and never have any clearance. There may be manufacturing tolerances involved and so even though the design has a precision/tight/close fit between the retainer and the contact, it may not always over-lap or exactly touch. Even if there is a small amount of clearance between the retainer and the contact, if the retainer is close enough to the contact, the retainer may still prevent the contact from rotating too far into an undesired position that could lead to dislodge of the contact or damage of the customer devices.

BRIEF DESCRIPTION OF THE SEVERAL VIEWS OF THE DRAWINGS

References are made to the accompanying drawings that form a part of this disclosure and which illustrate embodiments in which the systems and methods described in this specification can be practiced.

FIG. 4C is a side view of the housing of FIG. 4A, according to one embodiment.

FIG. 4D is a top view of the housing of FIG. 4A, according to one embodiment.

Like reference numbers represent like parts throughout.

DETAILED DESCRIPTION

Figure 1:
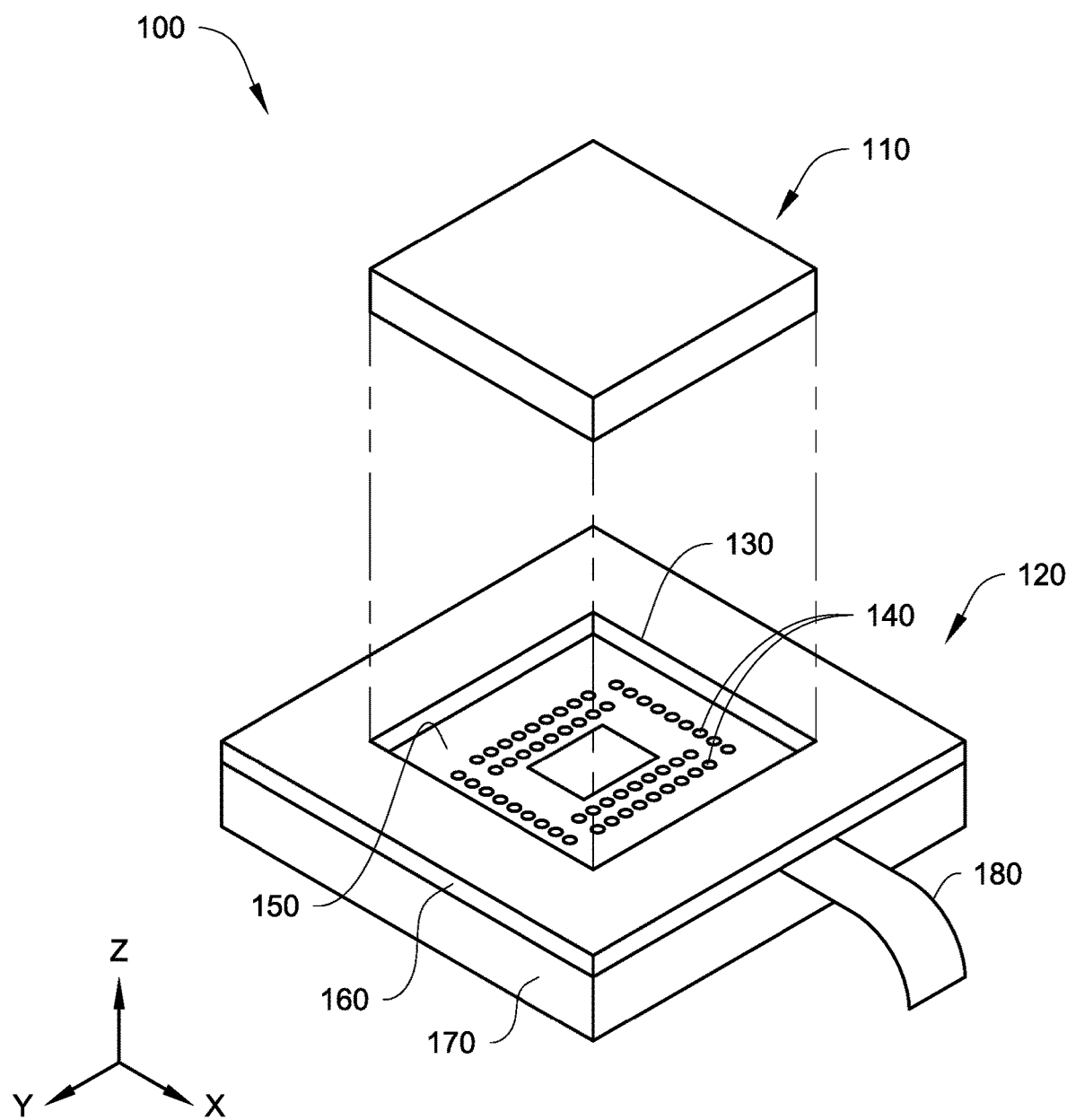
FIG. 1 is a perspective view of a part of a test system for receiving a DUT for testing, according to one embodiment.

A contact assembly typically includes a housing, a contact (or pin) being receivable in a slot of the housing, and two or more elastomers to bias the contact. As performance of the contact assembly increases, there may be less allowance for cross-sectional shape variation in the contacts, because changes in cross-section may cause changes to contact impedance, which may reflect a portion of the electrical signals. In some embodiments, the contact may be retained by the elastomers and a housing up-stop, which not only controls the contact free height, but also helps to retain the contact, especially when the contactor is not mounted to a load board.

For a particular contact assembly, a traditional housing up-stop, using a top wall of the housing such as shown in the Gilk U.S. Pat. No. 7,445,465 will not be suitable because the housing is thin (e.g., height in Z direction is at or about 0.75 mm, or less than at or about 1 mm) and the housing may not be strong enough to be used as an up-stop for the contacts. As performance of the contact assembly increases, the size of contacts keeps shrinking and as this happens some features may not be practical due to strength of materials and/or manufacturability. It will be appreciated that an optimal electrical performance may be provided by a constant cross-section conductor with a shape like a length of wire. Deviations from the straight or flat contact shape may cause degradations in performance. It may become more difficult to retain contacts when they are small with fewer deviations from a constant cross-section shape.

The contacts may be retained sufficiently well when the contactor assembly is fastened to a printed circuit board (e.g., a load board), but when the contact assembly is handled (e.g., removed from the load board), the contacts using elastomer bias will naturally rotate out of position and the opening in the upper surface of the housing is necessarily large enough that if the pin is rotated out of working position, it is liable to fall out through that upper opening. Embodiments disclosed herein provide adding material to the housing contact slot to block the pin from falling out though the top slot regardless of the pin position. This solution may also address the concerns that the material added may push the contact away from the housing tail stop and may cause sliding on the load board pads (i.e., shortening load board pad life), that the additional material may reduce contact compliance and cause poor wiping/cleaning of the DUT pad (which may cause undesired Mean Time Between Assists (MTBA)), and that the additional material may have to be located very accurately to avoid potential drawbacks, which may increase cost of manufacturing.

Embodiments disclosed herein move an existing area (e.g., clearance) of the housing. Embodiments disclosed herein may provide a reliable and/or repeatable functional feature that helps to retain the contact better when the contactor housing is being handled or maintained (e.g., removed from the load board). Embodiments disclosed herein may prevent the contact from rotating counter-clockwise when the housing is removed from the load board.

FIG. 1 is a perspective view of a part of a test system 100 for receiving a DUT 110 for testing, according to one embodiment.

The test system 100 includes a test assembly 120 for a DUT (e.g., a microcircuit, etc.) 110. The test assembly 120 includes a load board 170 that supports an alignment plate 160 having an opening or aperture 130 that precisely defines the X and Y (see the coordinate indicators X and Y, where the coordinate X is perpendicular to the coordinate Y, and the coordinate Z is perpendicular to the plane of X and Y) positioning of the DUT 110 in test assembly 120. If the DUT 110 has orientation features, it is common practice to include cooperating features in aperture 130. Load board 170 carries on its surface, connection pads connected to a cable 180 by Signal and Power (S&P) conductors. Cable 180 connects to the electronics that perform that electrical testing of the DUT 110. Cable 180 may be very short or even internal to the test assembly 120 if the test electronics are integrated with the test assembly 120, or longer if the test electronics are on a separate chassis. It will be appreciated that the embodiment is a non-limiting example of the test system. The load board and electrical connections made to it may be different than that described without impacting the functionality of the contactor assembly.

A test contact array 140 having a number of individual test contact elements (contactor assemblies, described in detail later) precisely mirrors the terminals carried on the surface of the DUT 110. When the DUT 110 is inserted in the aperture 130, terminals of the DUT 110 precisely align with test contact array 140. The test assembly 120 is designed for compatibility with a test contact array 140 incorporating the device. Test contact array 140 is carried on a contact membrane or sheet or socket 150. Socket 150 typically includes an insulating main body (or housing), which may be made of plastic or conductive metal or any other suitable materials. Individual test contacts in array 140 are preferably formed on and in socket 150 using well-known photolithographic and laser machining processes or any other suitable process. Socket 50 has alignment features such as holes or edge patterns located in the area between alignment plate 160 and load board 170 that provide for precise alignment of socket 150 with corresponding projecting features on alignment plate 160. All of the test contacts 140 are in precise alignment with the socket 150 alignment features. In this way, the test contacts of array 140 are placed in precise alignment with aperture 130.

Figure 2A:
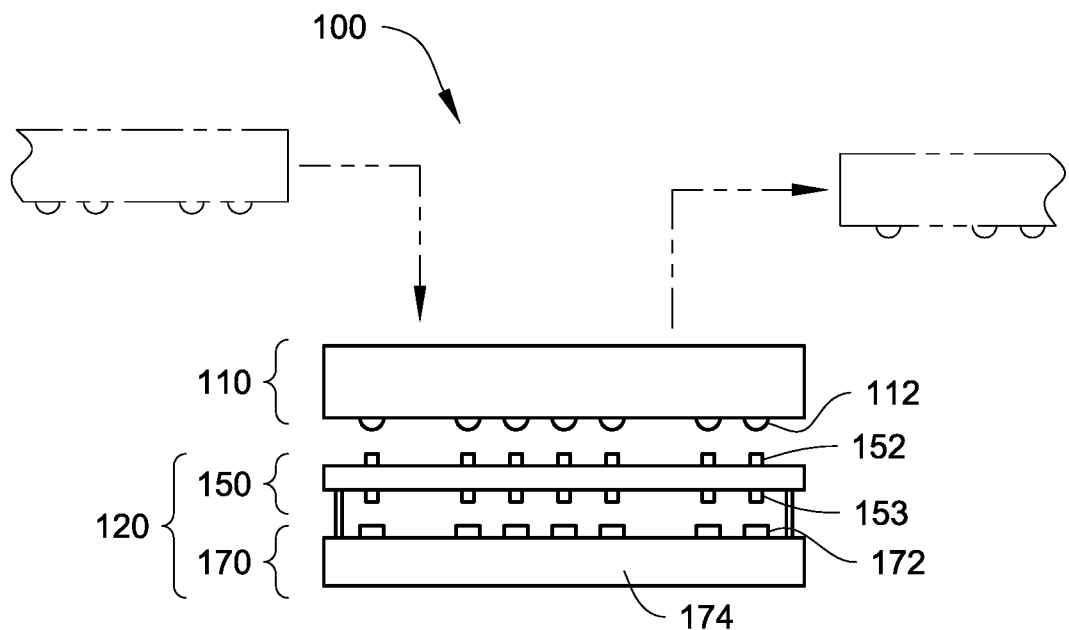
FIG. 2A is a side-view drawing of a portion of the test system for receiving a DUT for electrical testing, according to one embodiment.
Figure 2B:
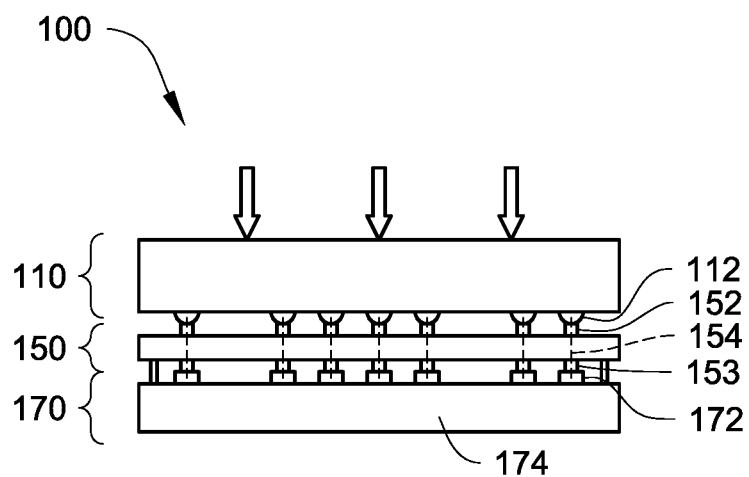
FIG. 2B is a side-view drawing of the test system of FIG. 2A, with the DUT electrically engaged, according to one embodiment.

FIG. 2A is a side-view drawing of a portion of the test system 100 for receiving the DUT 110 for electrical testing, according to one embodiment. FIG. 2B is a side-view drawing of the test system 100 of FIG. 2A, with the DUT 110 electrically engaged, according to one embodiment.

As shown in FIG. 2A, the DUT 110 is placed onto the test assembly 120, electrical testing is performed, and the DUT 110 is then removed from the test assembly 120. Any electrical connections are made by pressing components into electrical contact with other components; there is no soldering or de-soldering at any point in the testing of the DUT 110. The entire electrical test procedure may only last about a fraction of a second, so that rapid, accurate placement of the DUT 100 becomes important for ensuring that the test system 100 is used efficiently. The high throughput of the test assembly 120 usually requires robotic handling of the DUT 110. In most cases, an automated mechanical system places the DUT 110 onto the test assembly 120 prior to testing, and removes the DUT 110 once testing has been completed. The handling and placement mechanism may use mechanical and optical sensors to monitor the position of the DUT 110, and a combination of translation and rotation actuators to align and place the DUT 110 on or in the test assembly 120. Alternatively, the DUT 110 may be placed by hand, or placed by a combination of hand-fed and automated equipment.

The DUT 110 typically includes signal and power terminals 112 (see also terminals 112 of FIG. 1B) that connect to the socket 150 or other PCBs. The terminals may be on one side of the DUT 100, or may be on both sides of the DUT 110. For use in the test assembly 120, all the terminals 112 should be accessible from one side of the DUT 110, although it will be understood that there may be one or more elements on the opposite side of the DUT 110, or that there may be other elements and/or terminals on the opposite side that may not be tested by accessing terminals 112. Each terminal 112 is formed as a small, pad on button side of the DUT 110 or possibly a lead protruding from the body of the DUT 110. Prior to testing, the pad or lead 112 is attached to an electrical lead that connects internally to other leads, to other electrical components, and/or to one or more chips in the DUT. The volume and size of the pads or leads may be controlled quite precisely, and there is typically not much difficulty caused by pad-to-pad or lead-to-lead size variations or placement variations. During testing, the terminals 112 remain solid, and there is no melting or re-flowing of any solder.

The terminals 112 may be laid out in any suitable pattern on the surface of the DUT 110. In some cases, the terminals 112 may be in a generally square grid, which is the origin of an expression that describes the DUT 110, QFN, DFN, MLF or QFP for leaded parts. There may also be deviations away from a rectangular grid, including irregular spacing and geometries. It will be understood that the specific locations of the terminals may vary as needed, with corresponding locations of pads on the load board 170 and contacts on the socket 150 or housing being chosen to match those of the terminals 112. In general, the spacing between adjacent terminals 112 is in the range of 0.25 to 1.5 mm, with the spacing being commonly referred to as a "pitch". When viewed from the side, as in FIG. 2A, the DUT 110 displays a line of terminals 112, which may optionally include gaps and irregular spacing. These terminals 112 are made to be generally planar, or as planar as possible with typical manufacturing processes. In many cases, if there are chips or other elements on the DUT 110, the protrusion of the chips is usually less than the protrusion of the terminals 112 away from the DUT 110.

The test assembly 120 of FIG. 2A includes a load board 170. The load board 170 includes a load board substrate 174 and circuitry that is used to test electrically the DUT 110. Such circuitry may include driving electronics that can produce one or more AC voltages having one or more particular frequencies, and detection electronics that can sense the response of the DUT 110 to such driving voltages. The sensing may include detection of a current and/or voltage at one or more frequencies. In general, it is highly desirable that the features on the load board 170, when mounted, are aligned with corresponding features on the DUT 110. Typically, both the DUT 110 and the load board 170 are mechanically aligned to one or more locating features on the test assembly 120. The load board 170 may include one or more mechanical locating features, such as fiducials or precisely-located holes and/or edges, which ensure that the load board 170 may be precisely seated on the test assembly 120. These locating features typically ensure a lateral alignment (X, Y, see FIG. 1) of the load board 170, and/or a longitudinal alignment (Z, see FIG. 1) as well.

In general, the load board 170 may be a relatively complex and expensive component. The housing/test assembly 120 performs many functions including protecting the contact pads 172 of the load board 170 from wear and damage. Such an additional element may be an interposer membrane (or socket) 150. The socket 150 also mechanically aligns with the load board 170 with suitable locating features (not shown), and resides in the test assembly 120 above the load board 170, facing the DUT 110. The socket 150 includes a series of electrically conductive contacts (contactor assemblies, each including a contact head 152 and a contact tail 153, described in detail later, see also 140 of FIG. 1), which extend longitudinally outward on either side of the socket 150. Each contactor assembly (152, 153) may include a resilient element, such as a spring or an elastomer material, and is capable of conducting an electrical current to/from the load board 170 from/to the DUT 110 with sufficiently low resistance or impedance. Each contactor assembly (152, 153) may be a single conductive unit, or may alternatively be formed as a combination of conductive elements. In general, each contactor assembly (152, 153) connects one contact pad 172 on the load board 170 to one terminal 112 on the DUT 110, although there may be testing schemes in which multiple contact pads 172 connect to a single terminal 112, or multiple terminals 112 connect to a single contact pad 172. For simplicity, we assume in the text and drawings that a single contactor assembly (152, 153) connects a single pad 172 to a single terminal 112, although it will be understood that any of the tester elements disclosed herein may be used to connect multiple contact pads 172 connect to a single terminal 112, or multiple terminals 112 to a single contact pad 172.

Typically, the socket 150 electrically connects the load board pads 172 and the bottom contact surface of the DUT 110. Although the socket 150 may be removed and replaced relatively easily, compared with removal and replacement of the load board 170, we consider the socket 150 to be part of the test assembly 120 for this document. During operation, the test assembly 120 includes the load board 170, the socket 150, and the mechanical construction that mounts them and holds them in place (not shown). Each DUT 110 is placed against the test assembly 120, is tested electrically, and is removed from the test assembly 120. A single socket 150 may test many DUTs 110 before it wears out, and may typically last for several thousand tests or more before requiring replacement. In general, it is desirable that replacement of the socket 150 be relatively fast and simple, so that the test assembly 120 experiences only a small amount of down time for socket replacement. In some cases, the speed of replacement for the socket 150 may even be more important than the actual cost of each socket 150, with an increase in tester up-time resulting in a suitable cost savings during operation.

FIG. 2A shows the relationship between the test assembly 120 and the DUTs 110. When each DUT 110 is tested, it is placed into a suitable robotic handler with sufficiently accurate placement characteristics, so that a particular terminal 112 on the DUT 110 may be accurately and reliably placed (in X, Y and Z, see FIG. 1) with respect to corresponding contactor assemblies (152, 153) on the socket 150 and corresponding contact pads 172 on the load board 170. The robotic handler (not shown) forces each DUT 110 into contact with the test assembly 120. The magnitude of the force depends on the exact configuration of the test, including the number of terminals 112 being tested, the force to be used for each terminal, typical manufacturing and alignment tolerances, and so forth. In general, the force is applied by the mechanical handler of the tester (not shown), acting on the DUT 110. In general, the force is generally longitudinal, and is generally parallel to a surface normal of the load board 170.

FIG. 2B shows the test assembly 120 and DUT 110 in contact, with sufficient force being applied to the DUT 110 to engage the contactor assemblies (152, 153) and form an electrical connection 154 between each terminal 112 and its corresponding contact pad 172 on the load board 170. As stated above, there may alternatively be testing schemes in which multiple terminals 112 connect to a single contact pad 172, or multiple contact pads 172 connect to a single terminal 112, but for simplicity in the drawings we assume that a single terminal 112 connects uniquely to a single contact pad 172.

Figure 3A:
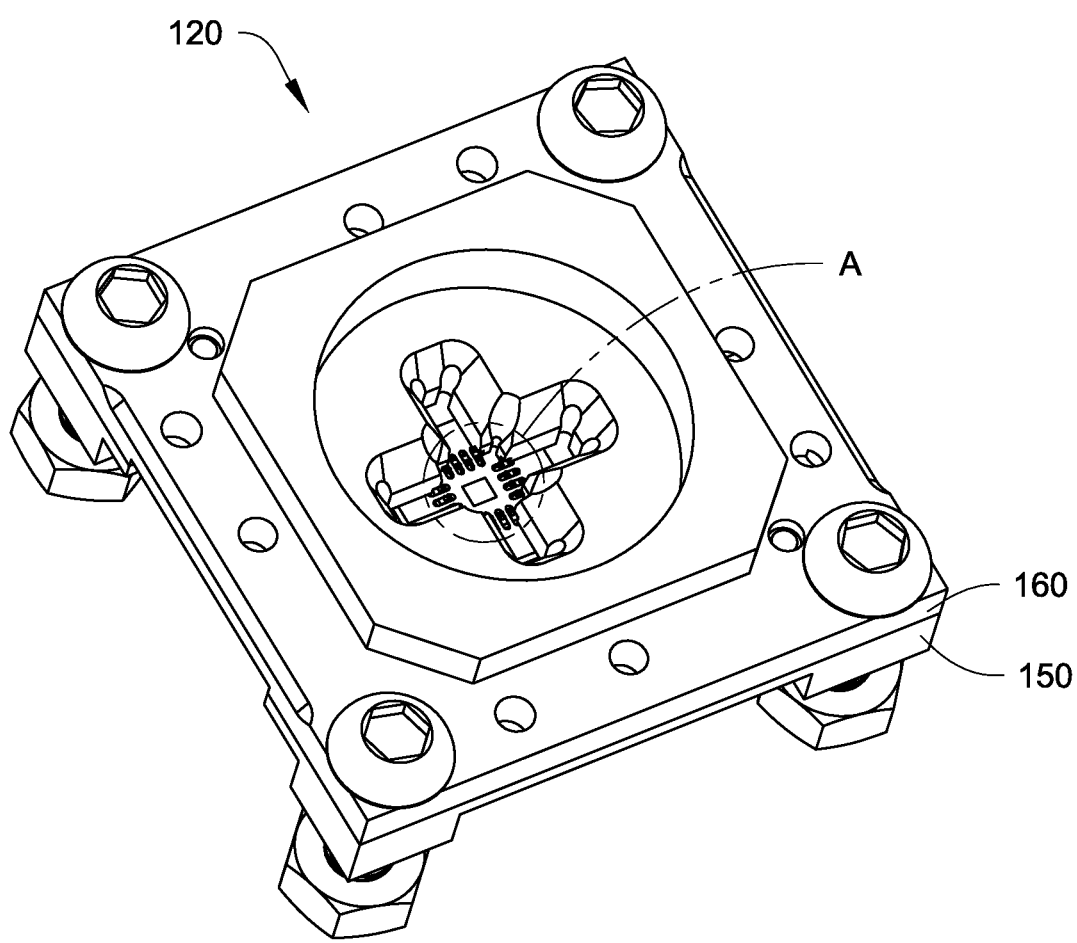
FIG. 3A is a perspective view of a test assembly, according to one embodiment.

FIG. 3A is a perspective view of a test assembly 120, according to one embodiment. The test assembly 120 includes a contact assembly 150 and an alignment plate 160, etc. The circled portion A of the test assembly 120 includes an enclosure.

Figure 3B:
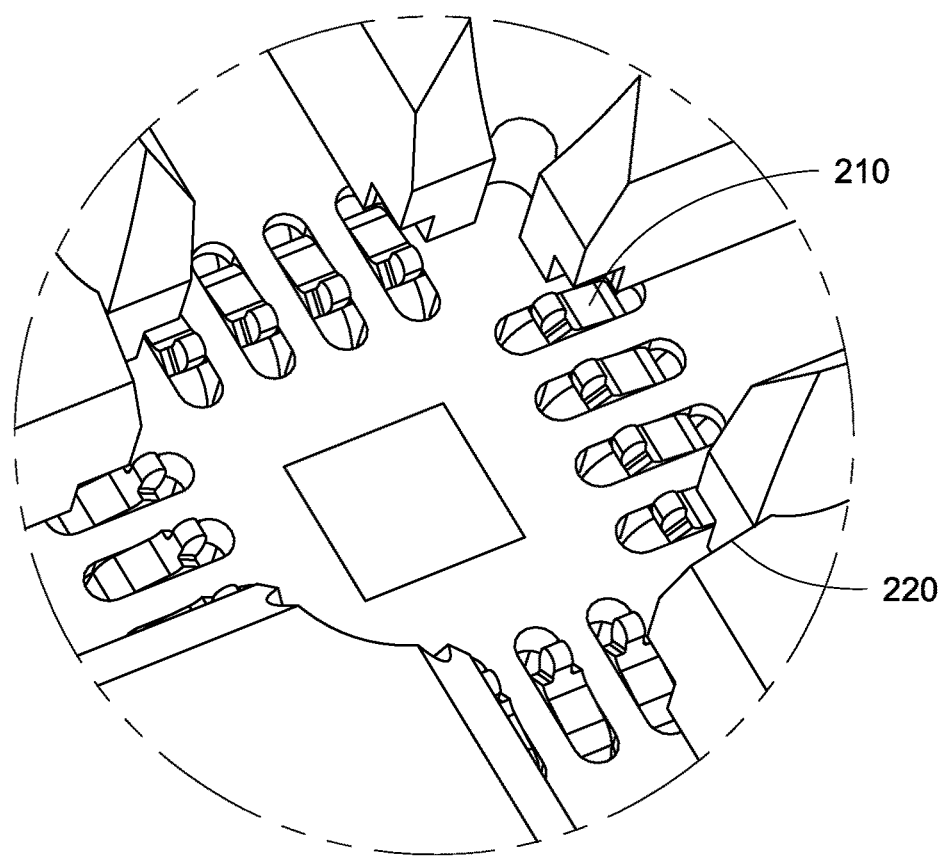
FIG. 3B is an enlarged top view of a portion of the test assembly of FIG. 3A, according to one embodiment.
Figure 3C:
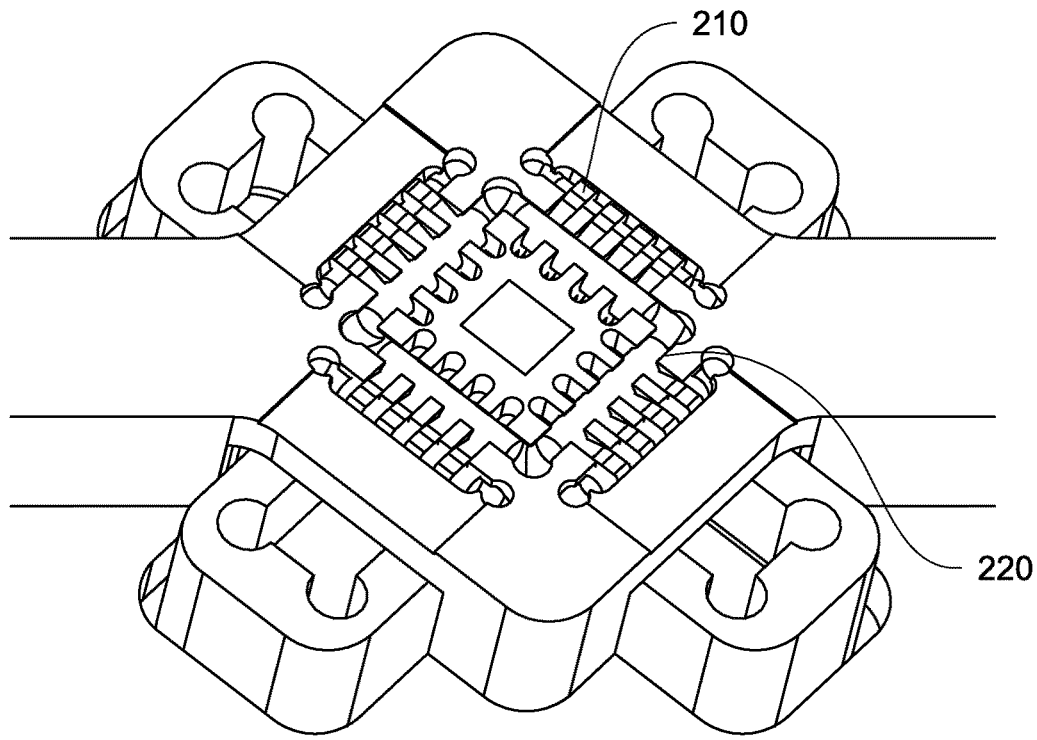
FIG. 3C is an enlarged bottom view of a portion of the test assembly of FIG. 3A, according to one embodiment.

FIG. 3B is an enlarged top view of a portion (the circled portion "A") of the test assembly 120 of FIG. 3A, according to one embodiment. FIG. 3C is an enlarged bottom view of a portion (the circled portion "A") of the test assembly 120 of FIG. 3A, according to one embodiment.

Figure 3D:
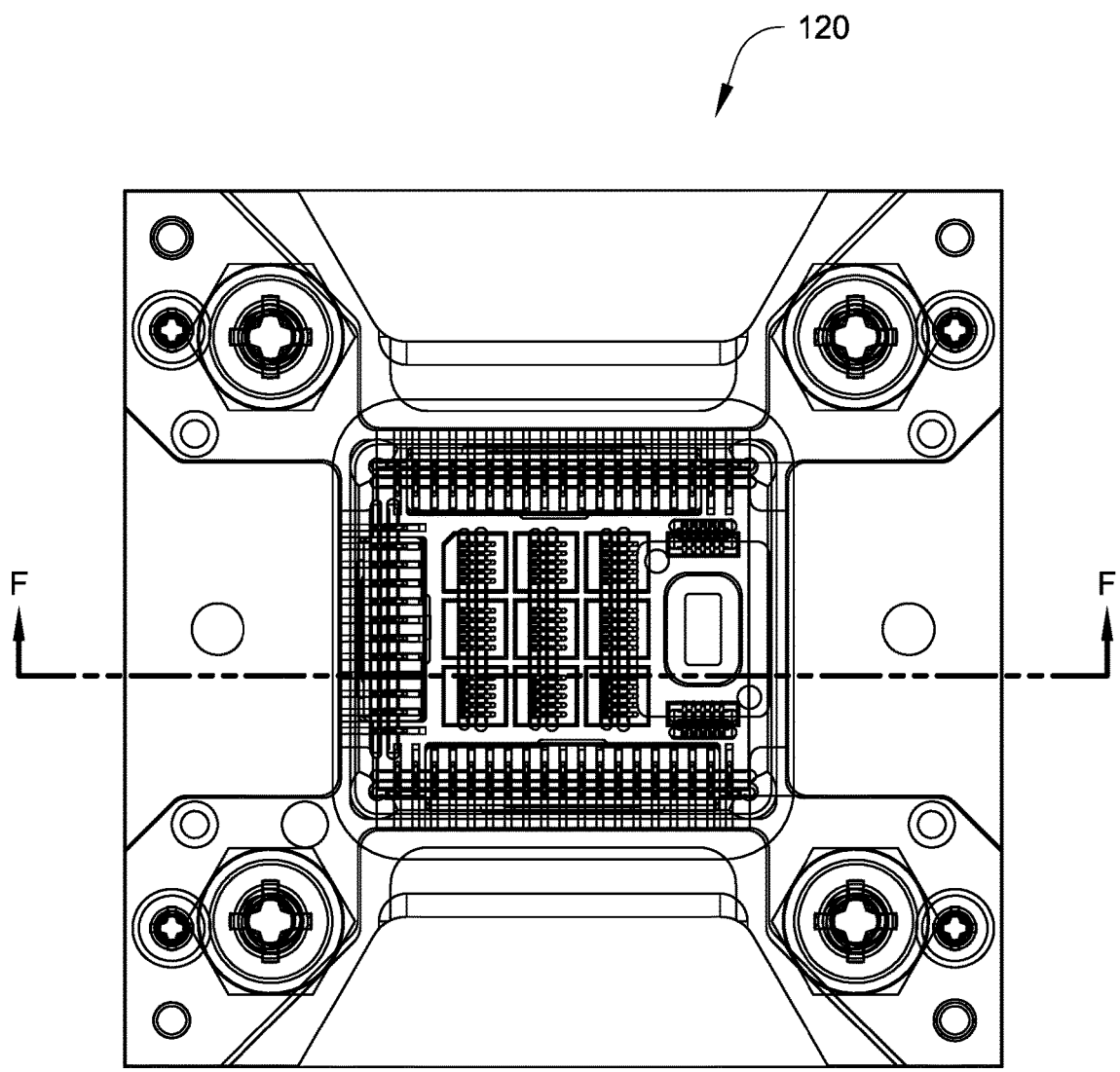
FIG. 3D is a top view of a test assembly, according to one embodiment.
Figure 3E:
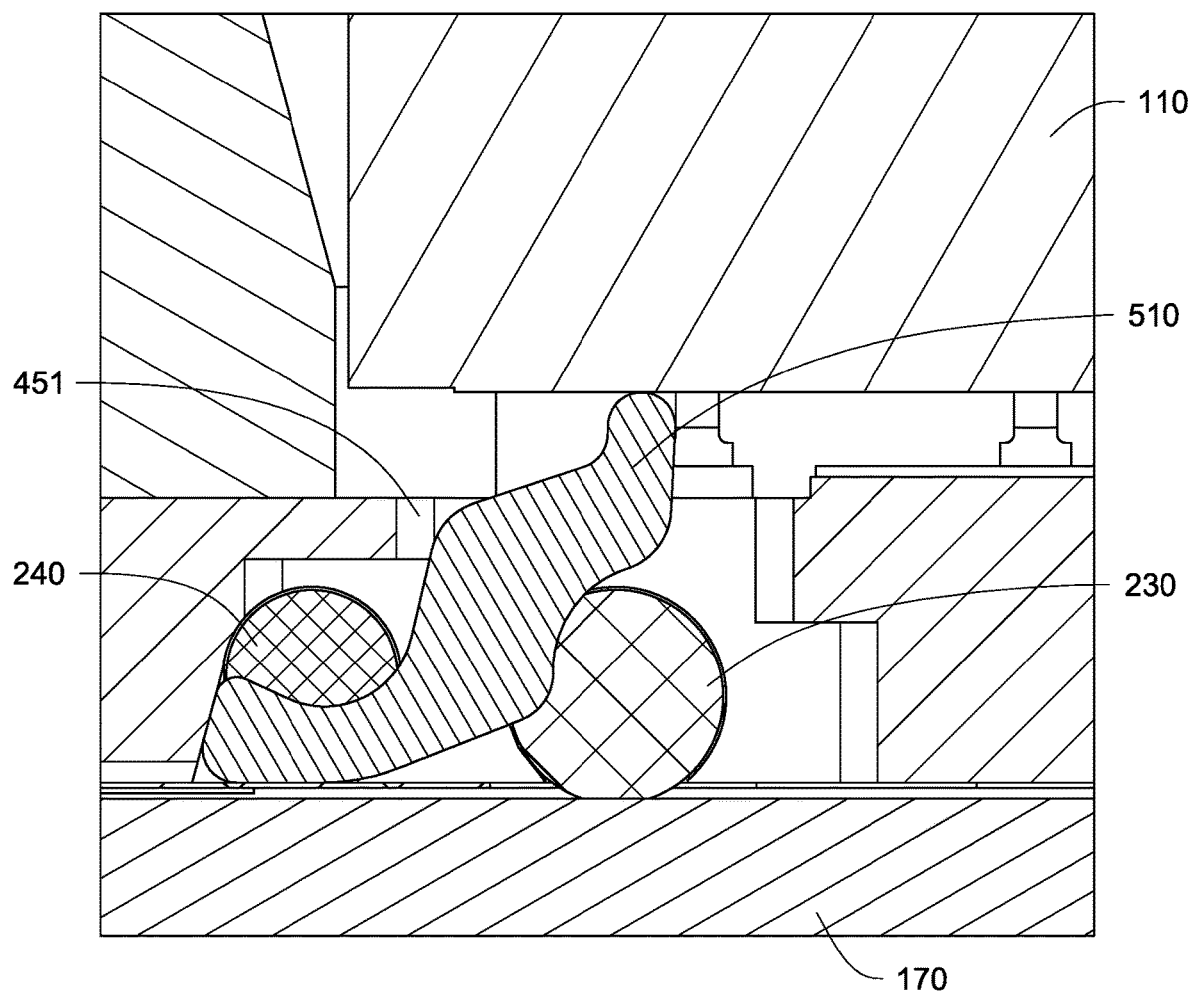
FIG. 3E is a cross-sectional view of the test assembly along the line F-F of FIG. 3D, according to one embodiment.

FIG. 3D is a top view of a test assembly 120, according to one embodiment. FIG. 3E is a cross-sectional view of the test assembly 120 along the line F-F of FIG. 3D, according to one embodiment. A connect 510 (or pin, described in detail later, see FIGS. 5A-5M) is biased by a first elastomer 240 and a second elastomer 230. A retainer 451 (described in detail later, see FIGS. 5E-5M) overlaps with the connector in the cross-sectional view. The head of the connect 510 engages with a terminal of the DUT 110, and a flat portion of the connect 510 engages with a terminal of the load board 170.

The test assembly includes an enclosure 220. A plurality of S&P terminals (contact assemblies, described in detail later) 210 is disposed on the enclosure 220. The enclosure has an opening in e.g., a central portion of the enclosure, to accommodate e.g., a ground block. It will be appreciated that in one embodiment, the size of the opening that accommodating the ground block matches the size of the ground pad of the DUT 110. The S&P terminals 210 align with the S&P terminals of the DUT 110.

Figure 4A:
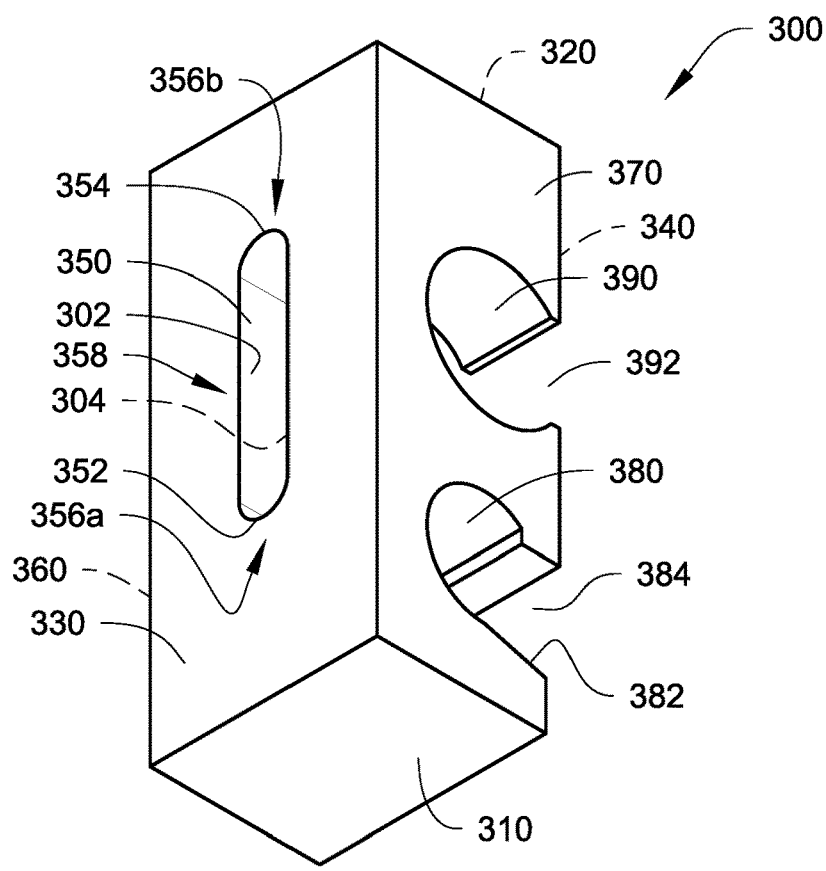
FIG. 4A is a perspective view of a housing of a contactor assembly, according to one embodiment.
Figure 4B:
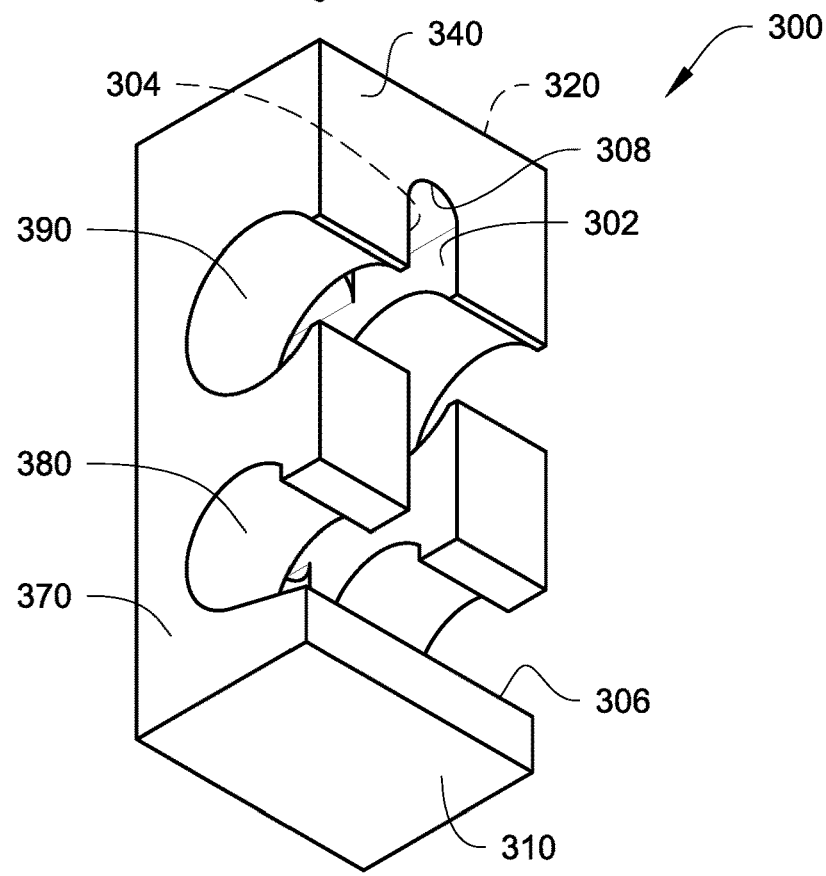
FIG. 4B is a perspective view of the housing of FIG. 4A at a different angle, according to one embodiment.
Figure 4E:
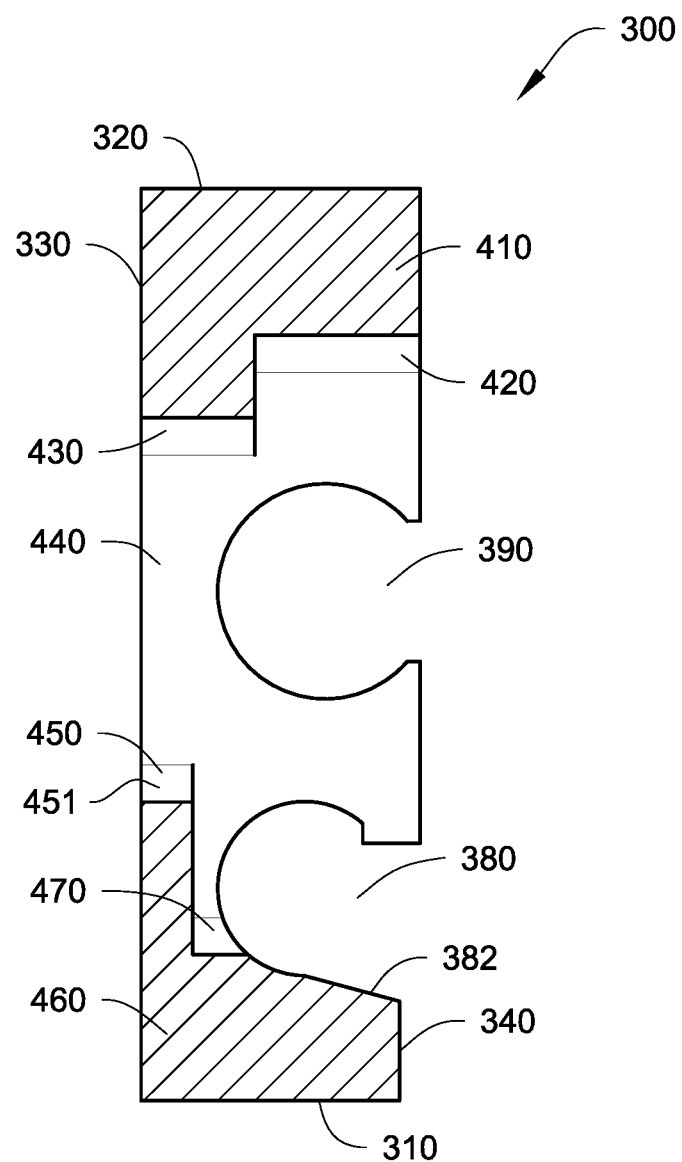
FIG. 4E is a cross-sectional view of the housing along the line B-B of FIG. 4D, according to one embodiment.

FIG. 4A is a perspective view of a housing 300 showing a single slot 350 of the housing of a contactor assembly, according to one embodiment. FIG. 4B is a perspective view of the housing 300 of the contactor assembly at a different angle, according to one embodiment. FIG. 4C is a side view of the housing 300 of the contactor assembly, according to one embodiment. FIG. 4D is a top view of the housing 300 of the contactor assembly, according to one embodiment. FIG. 4E is a cross-sectional view of the housing 300 of the contactor assembly, along the line B-B of FIG. 4D, according to one embodiment.

The contactor assembly includes a housing 300, a contact (510, see FIGS. 5A-5F), and two or more elastomers. It will be appreciated that different embodiments of the contactor assembly are described in U.S. Pat. Nos. 6,854,981, 7,445,465, and 9,274,141, which are also hereby incorporated by reference in their entirely. It will also be appreciated that to simplify the view and to show the features clearly, for illustration purpose, in some embodiments disclosed herein, the elastomers are not shown. The structures and functions of the elastomers may be the same or similar to the elastomers disclosed in the above-mentioned patents.

The housing 300 has a first end surface 310 and a second end surface 320. The direction from the first end surface 310 to the second end surface 320 may be referred to as a length (e.g., X direction, see FIG. 1) of the housing. The first end surface 310 and the second end surface 320 may be planar, have a substantially rectangular or square shape, and may be in parallel to each other.

The housing 300 has a first side surface 370 and a second side surface 360. The direction from the first side surface 370 to the second side surface 360 may be referred to as a thickness (e.g., Y direction, see FIG. 1) of the housing.

The housing 300 has a top surface 330 and a bottom surface 340. The direction from the top surface 330 to the bottom surface 340 may be referred to as a height (e.g., Z direction, see FIG. 1) of the housing. The top surface 330 and the bottom surface 340 may be planar, have a substantially rectangular or square shape, and may be in parallel to each other.

The housing 300 includes a first opening (or hole) 380 and a second opening (or hole) 390. The first opening 380 and the second opening 390 extend from the first side surface 370 to the second side surface 360 in the thickness direction. The bottom portions of the housing 300 near the first opening 380 and the second opening 390 are removed forming form apertures 384 and 392. In one embodiment, a diameter (or size) of the first opening 380 is smaller than a diameter (or size) of the second opening 390 when viewed in the thickness Y direction (i.e., in a side view).

The housing 300 includes a slot 350. The slot 350 is an open/hollow space and is configured to house at least a portion of the contact (510, see FIGS. 5A-5F) and at least a portion of the elastomers. The slot 350 extends from the top surface 330 to the bottom surface 340. At the top surface 330, the slot has a substantially stadium shape. It will be appreciated that a stadium shape may be referred to as a two-dimensional geometric shape constructed of a rectangle with semicircles at a pair of opposite sides. The stadium shape may be known also as a discorectangle, obround, or sausage body, etc.

In a top view (FIG. 4D), the slot 350 includes a first end 352 and a second end 354 opposite to the first end 352 in the length direction. The slot 350 includes a substantially semicircle portion 356a, a substantially rectangular portion 358, and a substantially semicircle portion 356b. At portion 356a, the thickness of the slot 350 may increases from 0 (at the end 352) to a maximum thickness (at the area reaching portion 358) that is defined by a distance from the first inner side wall 304 of the housing 300 to the second inner side wall 302 of the housing 300. At portion 358, the thickness of the slot 350 may be the maximum thickness. It will be appreciated that the thickness of the slot 350 in the housing 300 is slightly larger than the thickness of the contact (510, see FIGS. 5A-5F), which allows for tolerances plus room for the contact to move without sticking in the slot 350.

The slot 350 defines the first inner side wall 304 of the housing 300 and the second inner side wall 302 of the housing 300 opposite to the first inner side wall 304 in the thickness direction, and a first end wall 306 of the housing 300 and a second end wall 308 of the housing 300 opposite to the first end wall 306 in the length direction.

Near the bottom of the housing 300, a portion of the first inner end wall 306 defines a tail stop 382. The tail stop 382 of the housing 300 is configured to engage with a contact tail of the contact (510, see FIGS. 5A-5F) to keep the contact properly positioned. For example, when the contactor assembly is placed on the load board, the load board may push the contact tail toward the tail stop 382 so that a flat portion of the contact tail is engaged with the load board, and the tail stop 382 of the housing 300 may prevent (stop) the contact from being pushed further.

The first opening 380, the second opening 390, the apertures 384 and 392, and the slot are all connected. The apertures 384 and 392 extend from the first side surface 370 to the second side surface 360. At the bottom surface 340, the slot 350 is cut through by the apertures 384 and 392 in the thickness direction. In one embodiment, the first opening 380 and the second opening 390 are essentially cylindrically shaped.

FIG. 4E illustrates a first half of the housing 300 showing an internal structure of the slot 350. It will be appreciated that a second half of the housing 300 may be the same (mirror), or may be different from the first half (e.g., without a retainer feature). At areas 410 and 460, the thickness of the slot is 0 (i.e., no space or clearance). At area 440, the slot 350 has the maximum thickness. At area 450, a retainer (anti-dislodge mechanism) 451 is provided. In one embodiment, a height (Z direction) of the retainer 451 is at or about 0.125 mm (at or about 0.005 inch) and a height of the housing 300 is at or about 0.75 mm. In one embodiment, the thickness of the retainer 451 (which is defined as a distance from the inner side surface of the housing 300 to a corresponding side surface of the housing 300) is between half of the maximum thickness of the slot 350 (at the area reaching 460 where the thickness of the slot 350 is 0) and 0 (at the area reaching 440, where the thickness of the slot 350 is maximum but the thickness of the retainer 451 may be 0). In one embodiment, the retainer 451 has a curved shape (see portion 356a in FIG. 4D) and its thickness decreases from the first end 352 toward the area 440. In one embodiment, the thickness of the retainer 451 may be a predetermined constant. In one embodiment, the retainer 451 is disposed on the first inner side wall 304, on the second inner side wall 302, or on both the first inner side wall 304 and the second inner side wall 302. In one embodiment, the retainer 451 is a machined, integral part of the housing 300. In another embodiment, the retainer 451 may be an insert attached to an inner side wall (or both inner side walls) of the housing 300 to e.g., replace a worn out retainer.

In FIG. 4E, at area 470, the thickness of the slot 350 is between 0 (at the area reaching 460) and half of the maximum thickness of the slot 350 (at the area reaching 440). In one embodiment, the area 470 has a curved shape (similar to portion 356a in FIG. 4D) and the thickness of the slot 350 increases from the area reaching 460 toward the area 440. At area 430, the thickness of the slot 350 is between 0 (at the area reaching 410) and half of the maximum thickness of the slot 350 (at the area reaching 440). In one embodiment, the area 430 has a curved shape (see portion 356b in FIG. 4D) and the thickness of the slot 350 increases from the area reaching 410 toward the area 440. At area 420, the thickness of the slot 350 is between 0 (at the area reaching 410) and half of the maximum thickness of the slot 350 (at the area reaching 440). In one embodiment, the area 420 has a curved shape (similar to portion 356b in FIG. 4D) and the thickness of the slot 350 increases from the area reaching 410 toward the area 440.

Figure 5A:
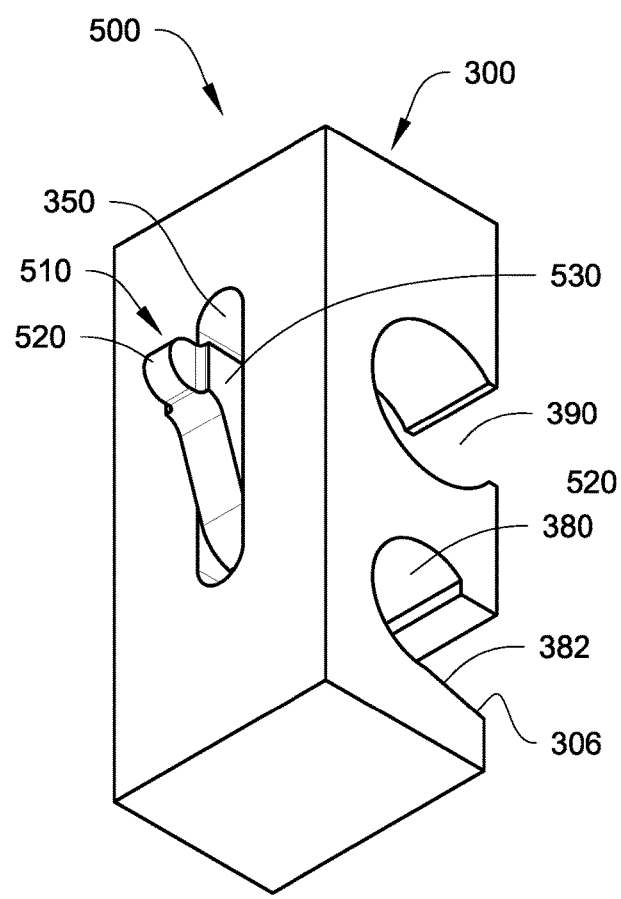
FIG. 5A is a perspective view of a contactor assembly, according to one embodiment.
Figure 5B:
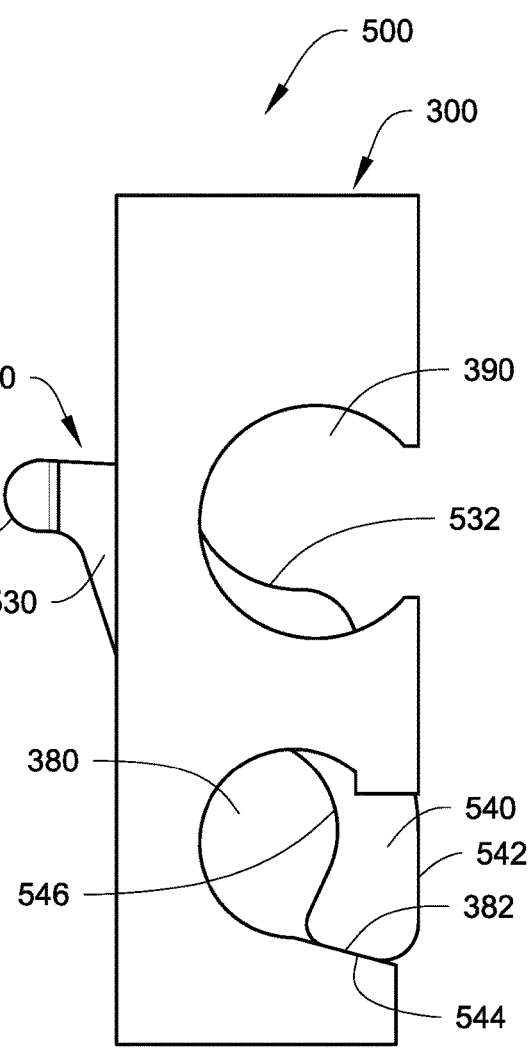
FIG. 5B a side view of the contactor assembly of FIG. 5A, according to one embodiment.
Figure 5C:
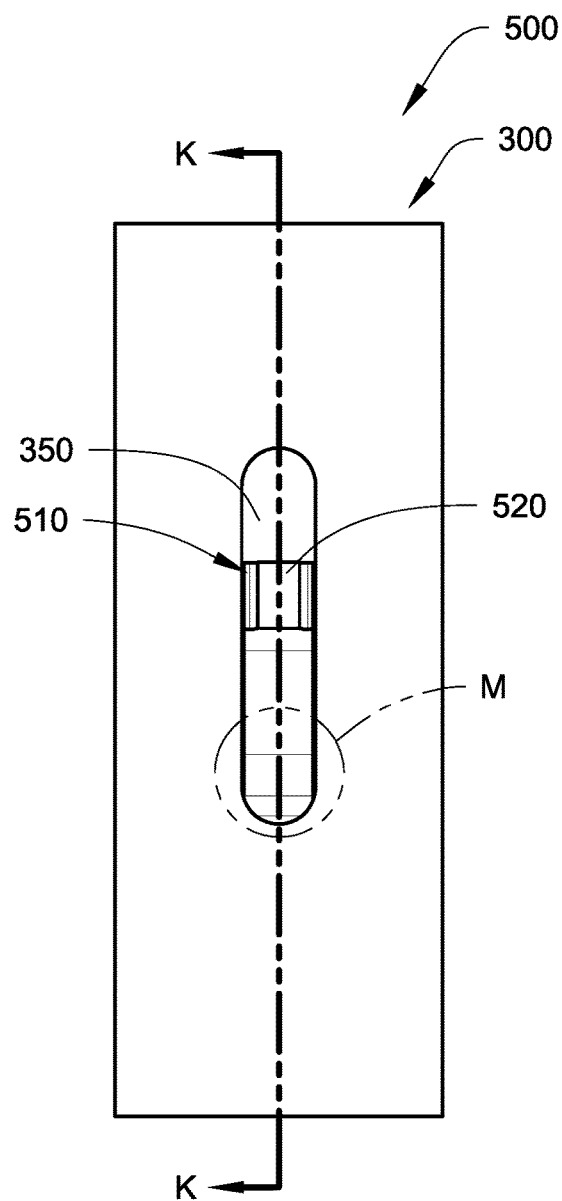
FIG. 5C is a top view of the contactor assembly of FIG. 5A, according to one embodiment.
Figure 5D:
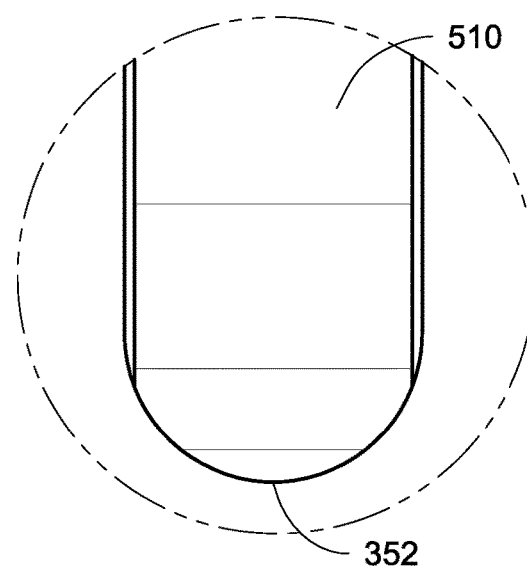
FIG. 5D is an enlarged view of a portion M of the contactor assembly of FIG. 5C, according to one embodiment.
Figure 5E:
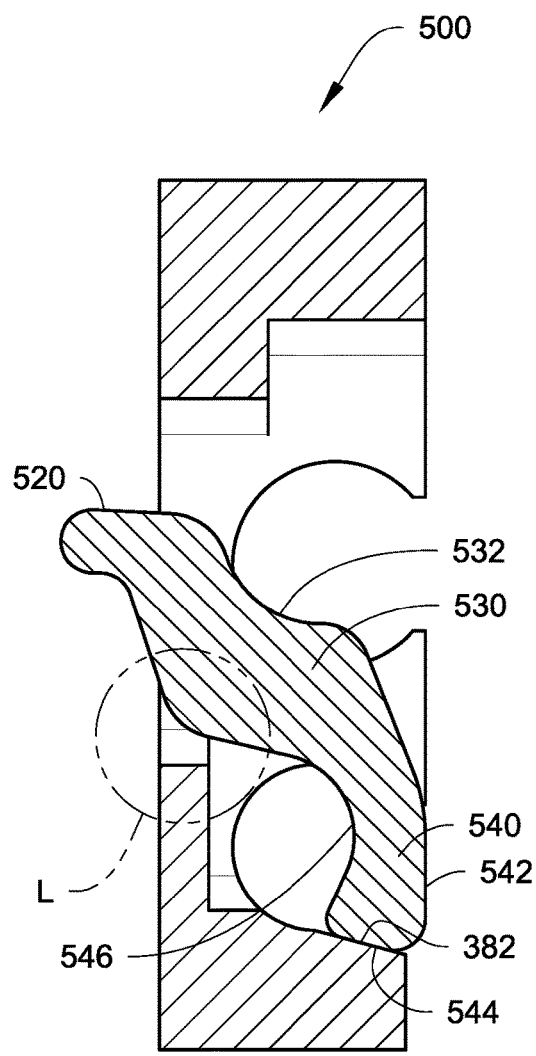
FIG. 5E is a cross-sectional view of the contactor assembly along the line K-K of FIG. 5C, according to one embodiment.
Figure 5F:
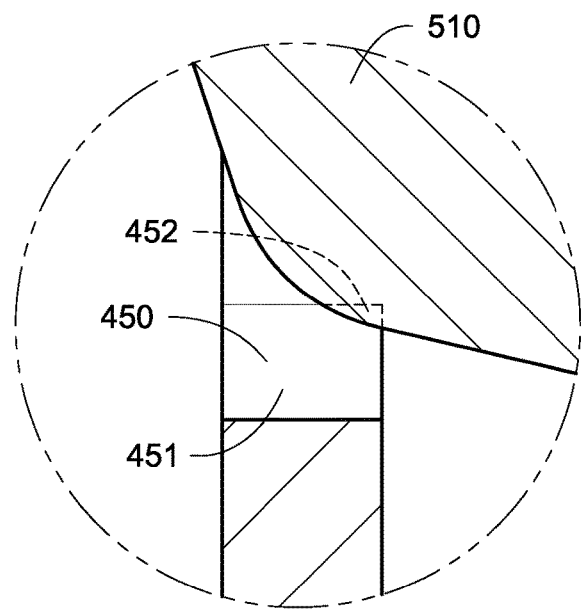
FIG. 5F is an enlarged view of a portion L of the contactor assembly of FIG. 5E, according to one embodiment.
Figure 5G:
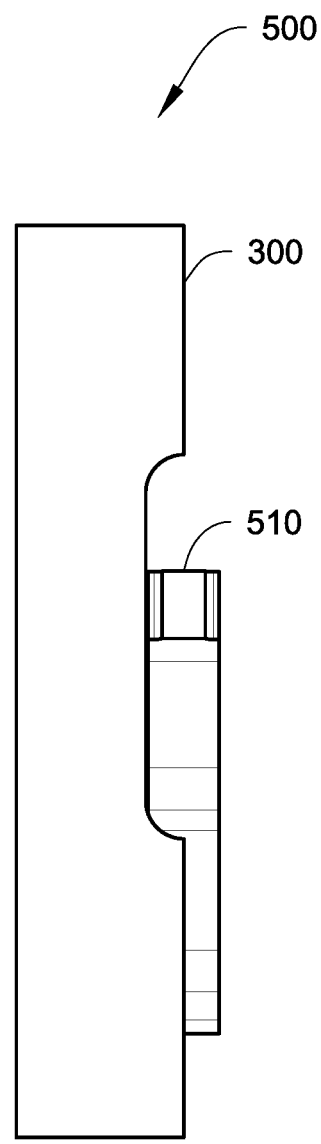
FIG. 5G is a top view of the contactor assembly showing half of the housing along the line K-K of FIG. 5C and a full contact, according to one embodiment.
Figure 5H:
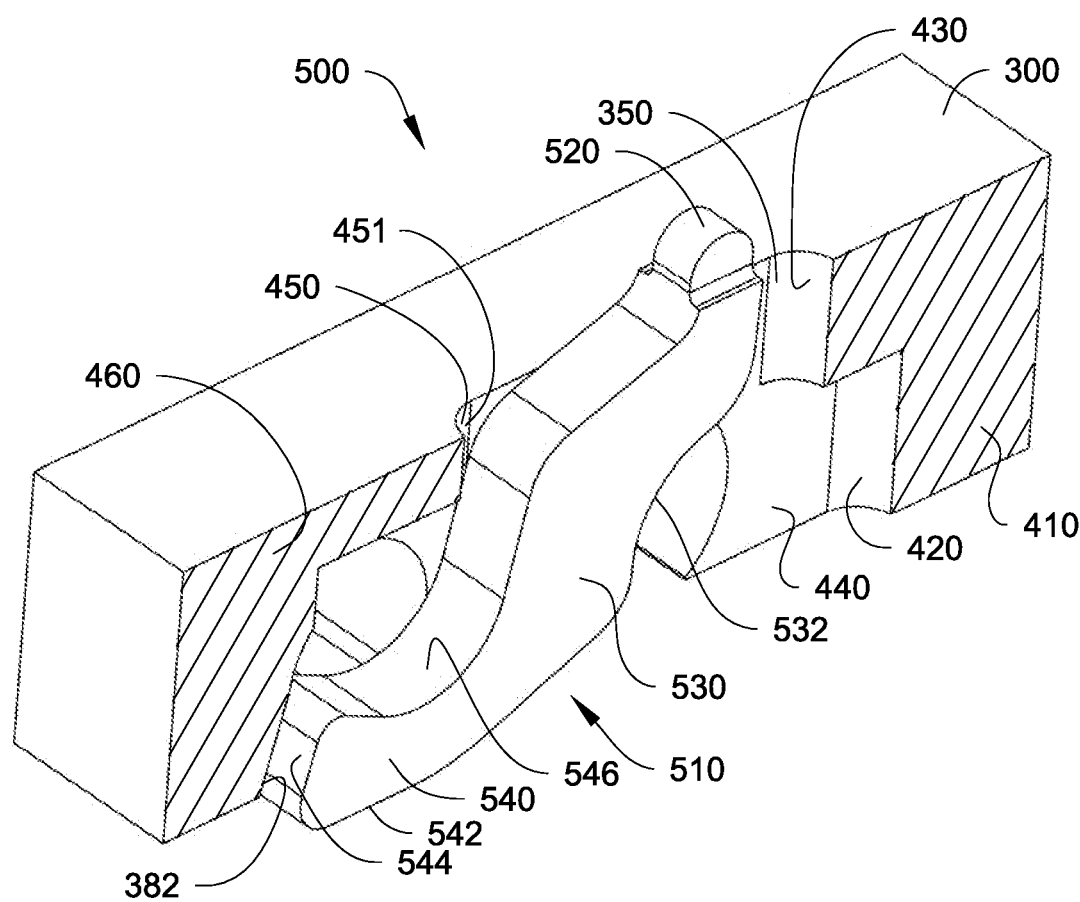
FIG. 5H is a perspective cross-sectional view of the contactor assembly showing half of the housing along the line K-K of FIG. 5C and a full contact, according to one embodiment.
Figure 5I:
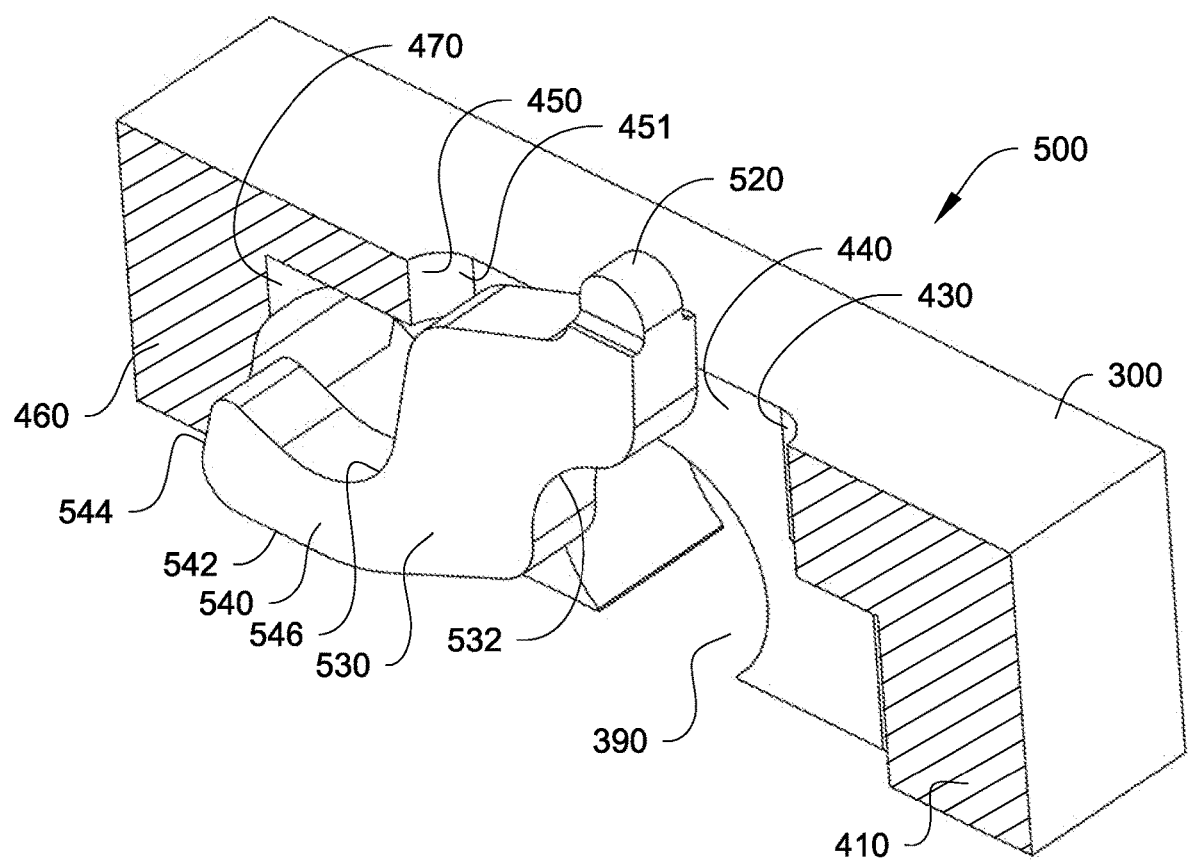
FIG. 5I is FIG. 5H viewed at a different angle, according to one embodiment.
Figure 5J:
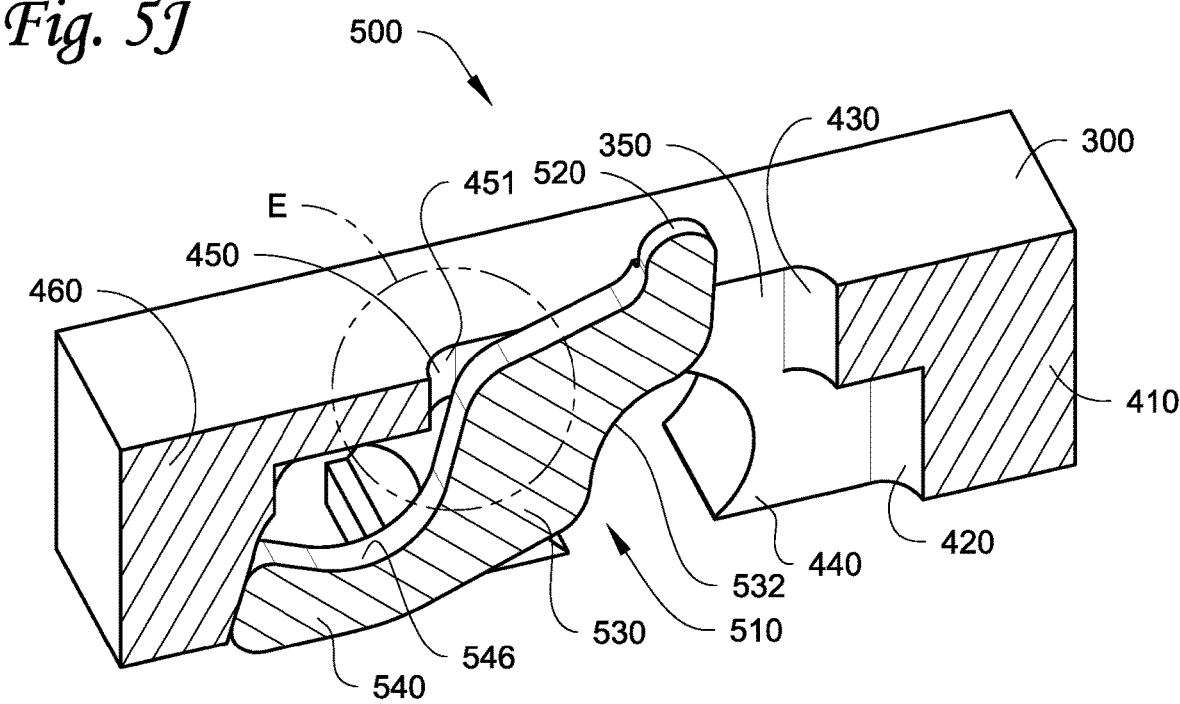
FIG. 5J is another perspective cross-sectional view of the contactor assembly showing half of the housing along the line K-K of FIG. 5C and a full contact, according to one embodiment.
Figure 5K:
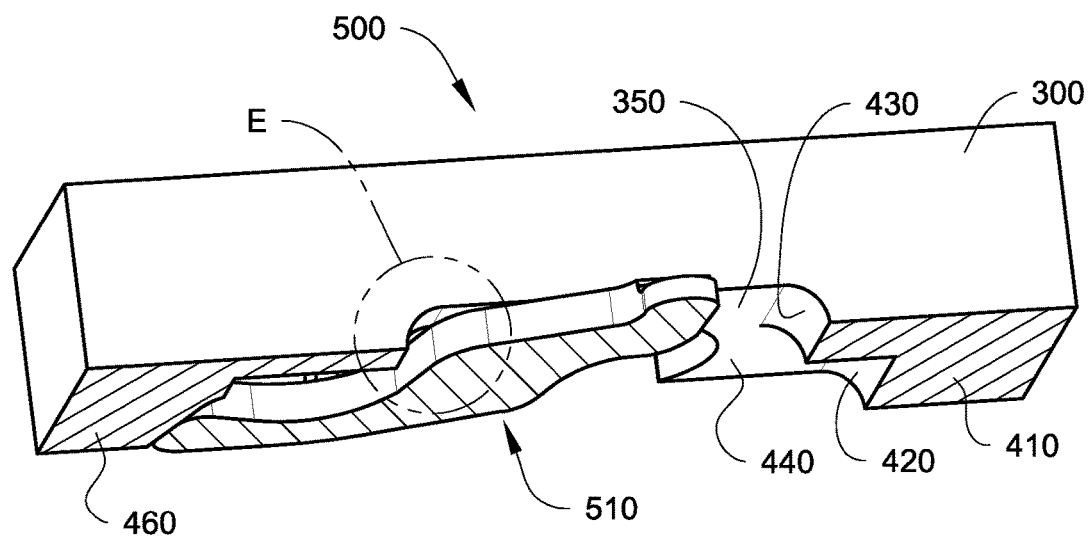
FIG. 5K is FIG. 5J viewed at a different angle, according to one embodiment.
Figure 5L:
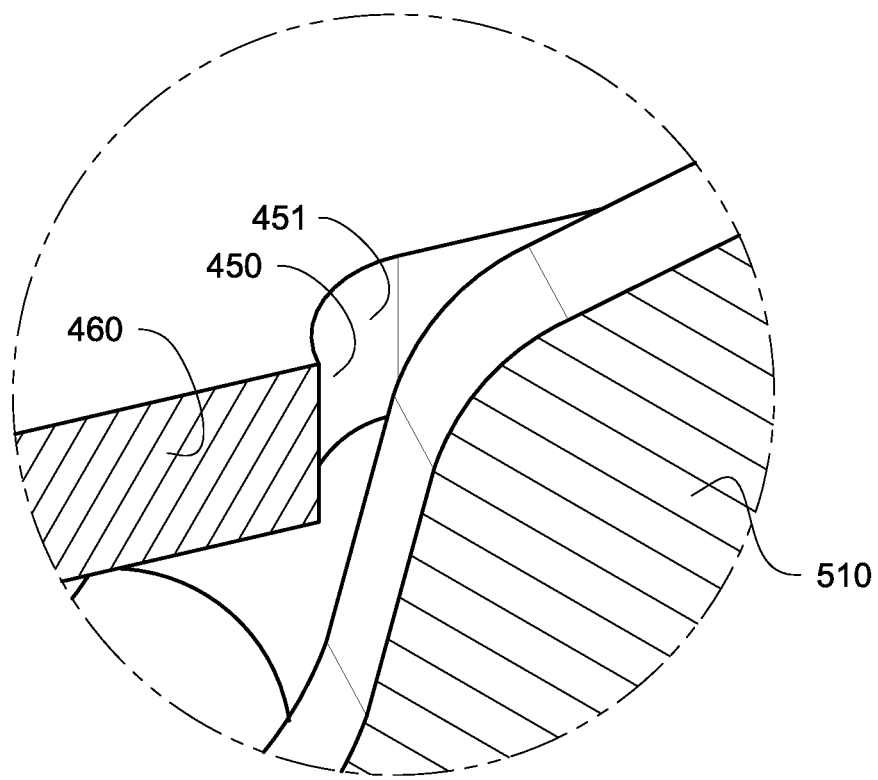
FIG. 5L is an enlarged view of a portion E of the contactor assembly of FIG. 5J, according to one embodiment.
Figure 5M:
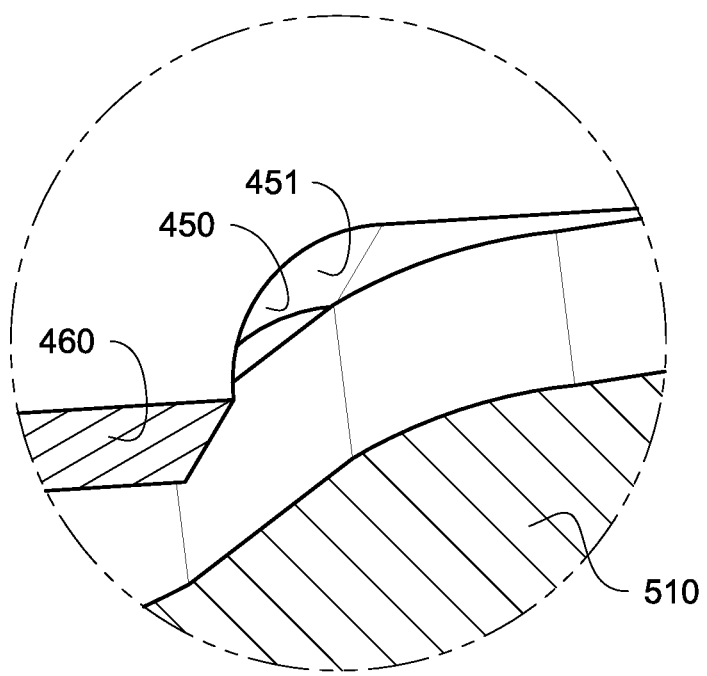
FIG. 5M is an enlarged view of a portion E of the contactor assembly of FIG. 5K, according to one embodiment.

FIG. 5A is a perspective view of a contactor assembly 500, according to one embodiment. FIG. 5B a side view of the contactor assembly 500, according to one embodiment. FIG. 5C is a top view of the contactor assembly 500, according to one embodiment. FIG. 5D is an enlarged view of a portion M of the contactor assembly 500, according to one embodiment. FIG. 5E is a cross-sectional view of the contactor assembly 500, along the line K-K of FIG. 5C, according to one embodiment. FIG. 5F is an enlarged view of a portion L of the contactor assembly 500, according to one embodiment. FIG. 5G is a top view of the contactor assembly 500 showing half of the housing 300 along the line K-K of FIG. 5C and a full contact 510, according to one embodiment. FIG. 5H is a perspective cross-sectional view of the contactor assembly 500 showing half of the housing 300 along the line K-K of FIG. 5C and a full contact 510, according to one embodiment. FIG. 5I is FIG. 5H viewed at a different angle, according to one embodiment. FIG. 5J is another perspective cross-sectional view of the contactor assembly 500 showing half of the housing 300 along the line K-K of FIG. 5C and a full contact 510, according to one embodiment. FIG. 5K is FIG. 5J viewed at a different angle, according to one embodiment. FIG. 5L is an enlarged view of a portion E of the contactor assembly 500 of FIG. 5J, according to one embodiment. FIG. 5M is an enlarged view of a portion E of the contactor assembly 500 of FIG. 5K, according to one embodiment.

The contactor assembly 500 includes the housing 300 (see FIGS. 4A-4E), a contact (or pin) 510, a first elastomer (not shown) extending through the first opening 380 and a second elastomer (not shown) extending through the second opening 380. It will be appreciated that to simplify the view and to show the features clearly, for illustration purpose, in some embodiments disclosed herein, the elastomers are not shown but the elastomers may be required during operation of the contactor assembly 500. For example, in FIG. 5B, the first elastomer (not shown) extends through the first opening 380 at the location where the reference number 380 points to, and/or the second elastomer (not shown) extends through the second opening 390 at the location where the reference number 390 points to, to bias the contact 510 during operation of the contactor assembly 500. In one embodiment, the first elastomer and the second elastomer are essentially cylindrically shaped and non-conductive. The contact 510 is conductive.

The contact 510 includes a contact head 520, a contact body 530, and a contact tail 540. In one embodiment, the contact body 530 has a concave inner edge 532 which is configured to engage and bear against the second elastomer. The contact tail 540 has a concave inner edge 546 which is configured to engage and bear against the first elastomer, which has a smaller diameter than the diameter of the second elastomer. The contact tail 540 has a flat portion 542 and a sloped terminus 544. The contact 510 is receivable in the slot 350 and has a thickness slightly smaller than the thickness of the 350 so that clearance may be formed between inner side wall(s) of the housing and the side surface(s) of the contact in the thickness direction.

In operation, when the sloped terminus 544 of the contact is engaged with the tail stop 382 of the first inner end wall 306 of the housing 300, at least a portion of the retainer 451 overlaps with the contact 510 forming at an overlapping area 452 (see dotted lines) in a cross-sectional view (see FIGS. 5E and 5F), and no clearance exists between the retainer 451 and the contact 510 in at least a portion of the overlapping area 452. In an embodiment, there may be a slight clearance between the retainer 451 and the contact 510 rather than overlapping. In such embodiment, the clearance may be very small based on how precisely it may be possible to manufacture the retainer 451. The overlapping area 452 for the retainer 451 is behind the contact 510 and is in a clearance between the contact 510 and the inner side wall 302 of the housing 300. At the overlapping area 452, the retainer 451 has a thickness to fill such clearance and to push the contact in the thickness Y direction to retain the contact 510 in place in the thickness direction (e.g., into and out of the paper) instead of in a height/vertical Z direction). The flat portion 542 is configured to engage with and rest on e.g., a pad of the load board. The contact head 520 is configured to engage with a terminal (pad, pin, etc.) of the DUT. The elastomers are configured to bias the contact 510.

It will be appreciated that for a thin housing 300, the strength (especially the vertical strength in the height Z direction) of the housing 300 may not be strong enough to hold the contact 510 in place, especially when the contact assembly 500 is removed from the load board. With the geometry, structure, and arrangement of the retainer 451, the force from the retainer 451 may be applied in a horizontal direction (e.g., length X direction) to the contact 510 instead of in a vertical direction, utilizing a strong part of the housing 300 in the horizontal direction (i.e., the housing 300 may not be strong in the vertical direction but may be strong enough in the horizontal direction to retain the contact 510 in place (serving as a stop for the contact 510), e.g., when the contact assembly 500 is removed from the load board.

It will be appreciated that areas 410, 420, 430, 440, 450, 460, and 470 in FIGS. 5H-5K are the same as or similar to areas 410, 420, 430, 440, 450, 460, and 470 in FIG. 4E. The retainer 451 (instead of a clearance feature such as 420, 430, 470) in the area 450 touches the contact 510 and prevents the contact 510 from rotating out of position when the sloped terminus 544 of the contact 510 is engaged with the first inner end wall 382 of the housing 300. It will be also appreciated that the retainer 451 may be a very small change (from a clearance feature such as 420, 430, 470) to a geometry (of a clearance feature such as 420, 430, 470), so the retainer may not interfere with or change the function of other parts of the contact assembly 500, but yet the retainer may help to prevent the contact 510 from falling out of the housing 300.

It will also be appreciated that area 470 is a part of the contact slot 350 that extends above the first elastomer (240, see FIG. 3E) area. The area 470 is configured to allow the elastomer 240 to flow into area 470 to control the amount of force that the elastomer 240 applies to the contact 510. Area 430 is a radius area at an end of the contact slot 350. Area 420 is also a radius area at an end of the contact slot 350. It will be appreciated that the contact slot 350 is cut longer at or near area 420 than at or near area 430 in order to provide room/clearance for the second elastomer (230, see FIG. 3E) to flow and to keep contact 510 forces from getting too high. Area 460 includes the tail-stop 382 area of the housing 300 that prevents the contact 510 from sliding on the load board 170 pad. Area 460 is the solid housing 300 at a first end of the contact slot 350. Area 410 is the solid housing 300 at a second end of the contact slot 350. It will further be appreciated that in an embodiment, the housing 300 is cross-sectioned through the middle of the contact slot 350 along the K-K line, and the two parts of the housing 300 along the K-K line are mirrored copies of each other. In an embodiment, the retainer 451 has a height (Z direction) at or about 0.125 mm (at or about 0.005 inch). In an embodiment, a distance from area 470 to the area 450 (where the retainer 451 is located) is at or about 0.36 mm. In an embodiment, the retainer 451 has a thickness (in Y direction, e.g., from an inner side wall of the housing to the overlapping area 452) of at or about 0.006 mm (or at or about 0.0002 inch) to touch the contact 510. It will be appreciated that the overlapped area 452a may be very small and there may be a small amount of clearance or interference between the contact 510 and the retainer 451 based on manufacturing tolerances. One function of the retainer 451 is to prevent a big rotation of the contact 510 shown in FIGS. 7B and 7C, so there may be some tolerances regarding the positioning (or dimension of) the retainer 451 without defeating its function. In an embodiment, the retainer 451 may be within at or about 0.1 mm of the optimal location (see FIG. 5F, 5L or 5M), or may have an offset of at or about 0.1 mm from its optimal location/dimension. In another embodiment, the retainer 451 may be within at or about 0.05 mm of the optimal location (see FIG. 5F, 5L or 5M), or may have an offset of at or about 0.05 mm from its optimal location/dimension.

Figure 6A:
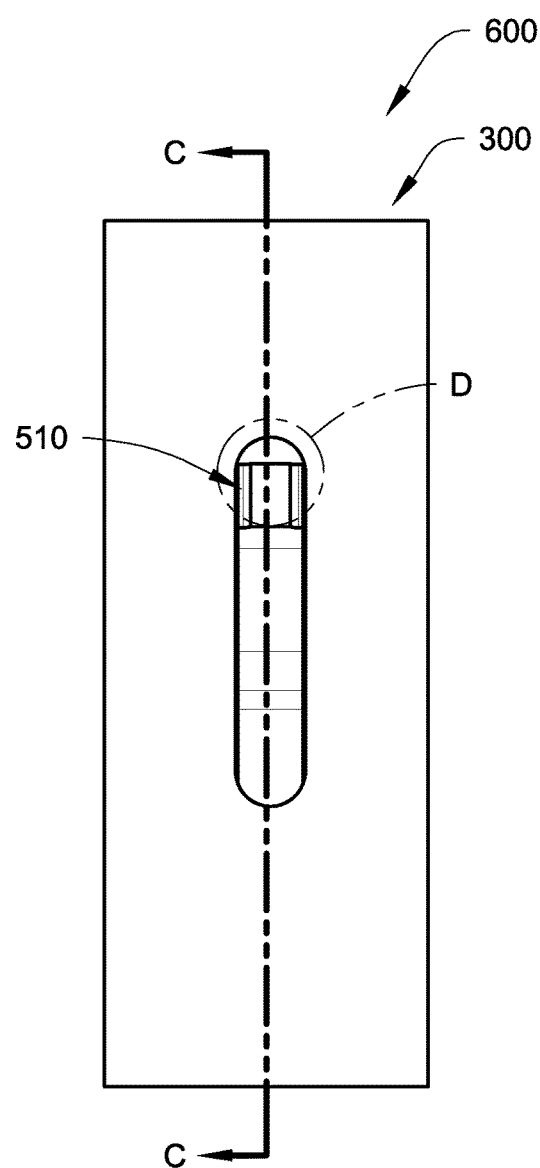
FIG. 6A is a top view of the contactor assembly, according to one embodiment.
Figure 6B:
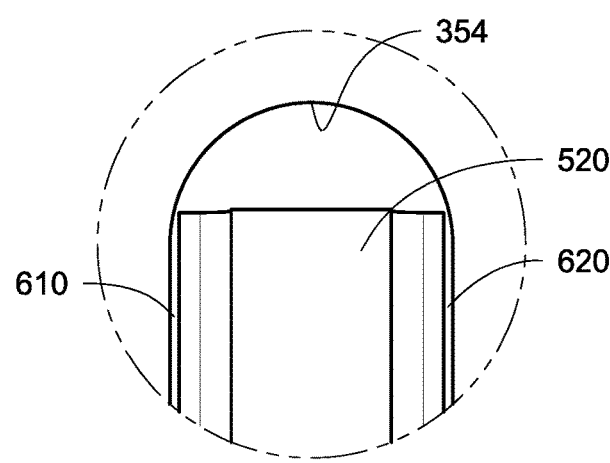
FIG. 6B is an enlarged view of a portion D of the contactor assembly of FIG. 6A, according to one embodiment.
Figure 6C:
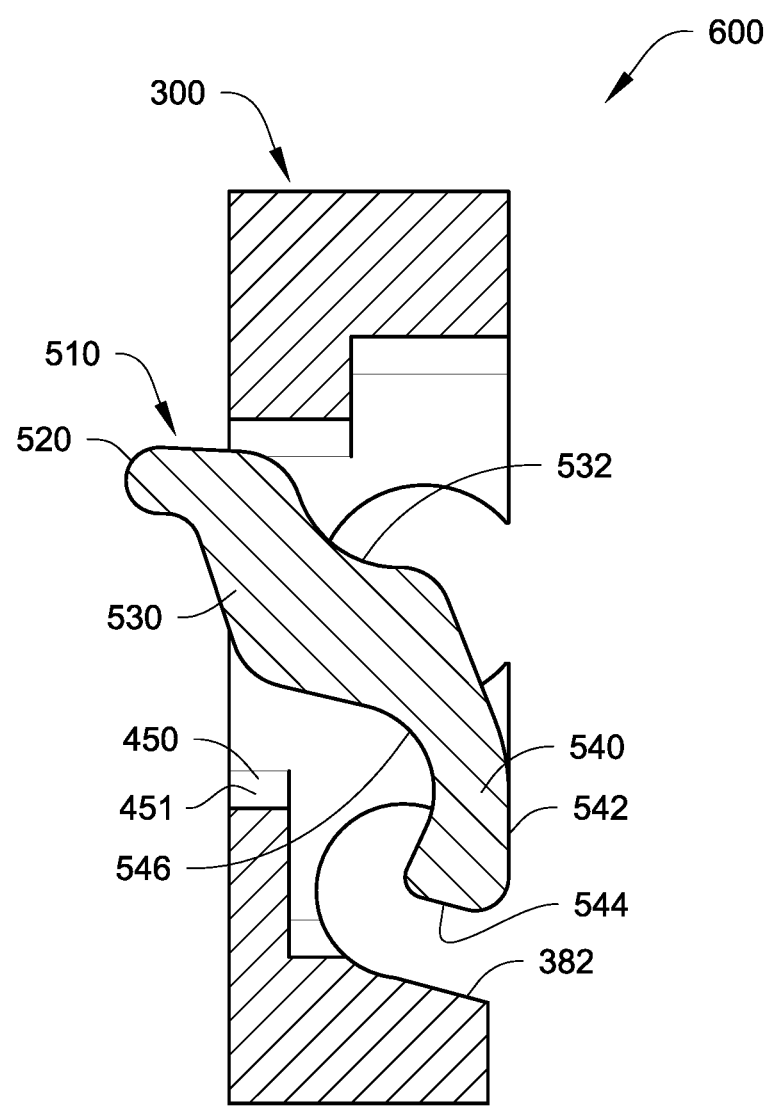
FIG. 6C is a cross-sectional view of the contactor assembly along the line C-C of FIG. 6A, according to one embodiment.

FIG. 6A is a top view of the contactor assembly 600, according to one embodiment. FIG. 6B is an enlarged view of a portion D of the contactor assembly 600, according to one embodiment. FIG. 6C is a cross-sectional view of the contactor assembly 600, along the line C-C of FIG. 6A, according to one embodiment.

The contactor assembly 600 is the same as the contactor assembly 500 of FIGS. 5A-5E, except that for illustration purpose, in the contactor assembly 600, the elastomers are removed and the contact 510 is placed in a different location (i.e., the sloped terminus 544 of the contact is not in a position to engage with the tail stop 382 of the first inner end wall 306 of the housing 300, and thus the retainer 451 may not overlap with the contact 510 in the cross-sectional view. In FIG. 6B, it can be shown that there are clearances 610, 620 between the inner side wall(s) of the housing 300 and the side surface(s) of the contact 510 in the thickness direction.

Referring back to FIGS. 5A-5F, in order for the retainer 451 to prevent the contact 510 from moving (counter clockwise) out of position, the retainer 451 may have to be designed to absorb the gap/clearance between slot 350 (or the inner wall(s) of the housing) and contact 510 before the retainer 451 may interfere with the contact 510. That is, the retainer 451 may overlap with the contact in the cross-sectional view.

Figure 7A:
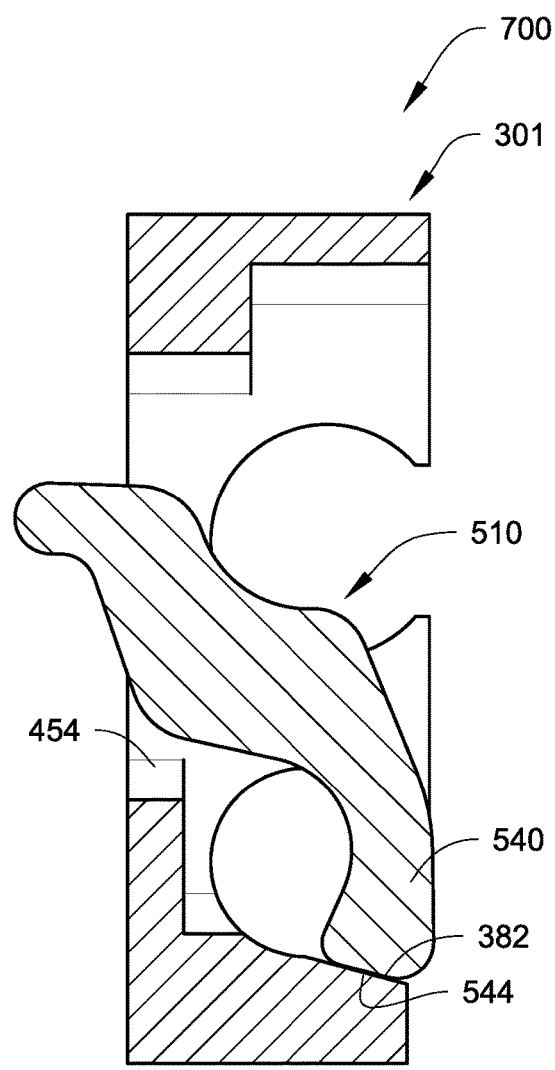
FIG. 7A is a cross-sectional view of a contactor assembly, according to one embodiment.
Figure 7B:
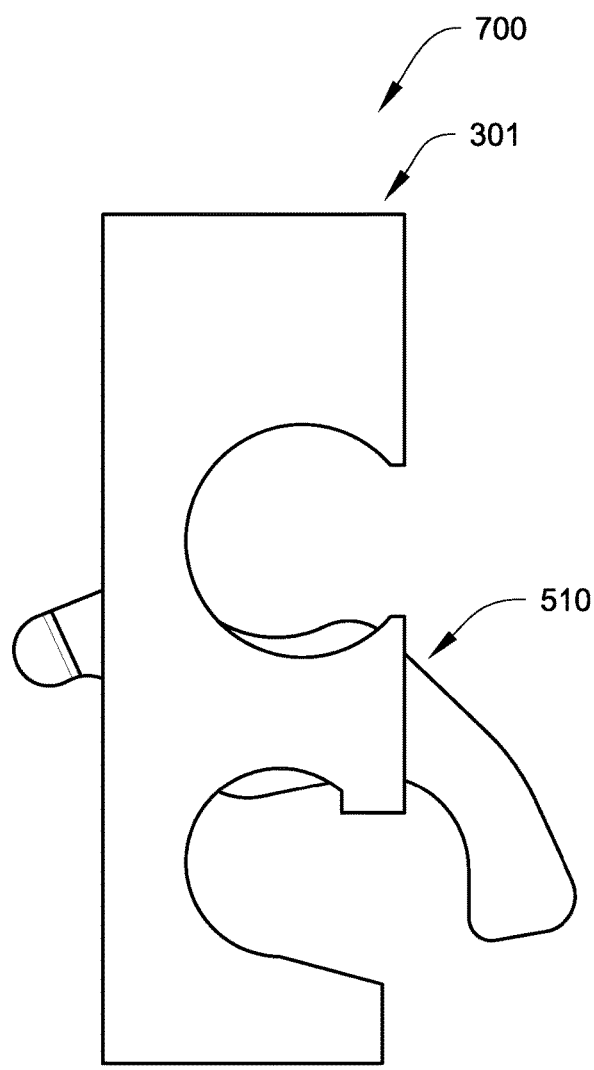
FIG. 7B is a side view of the contactor assembly of FIG. 7A, according to one embodiment.
Figure 7C:
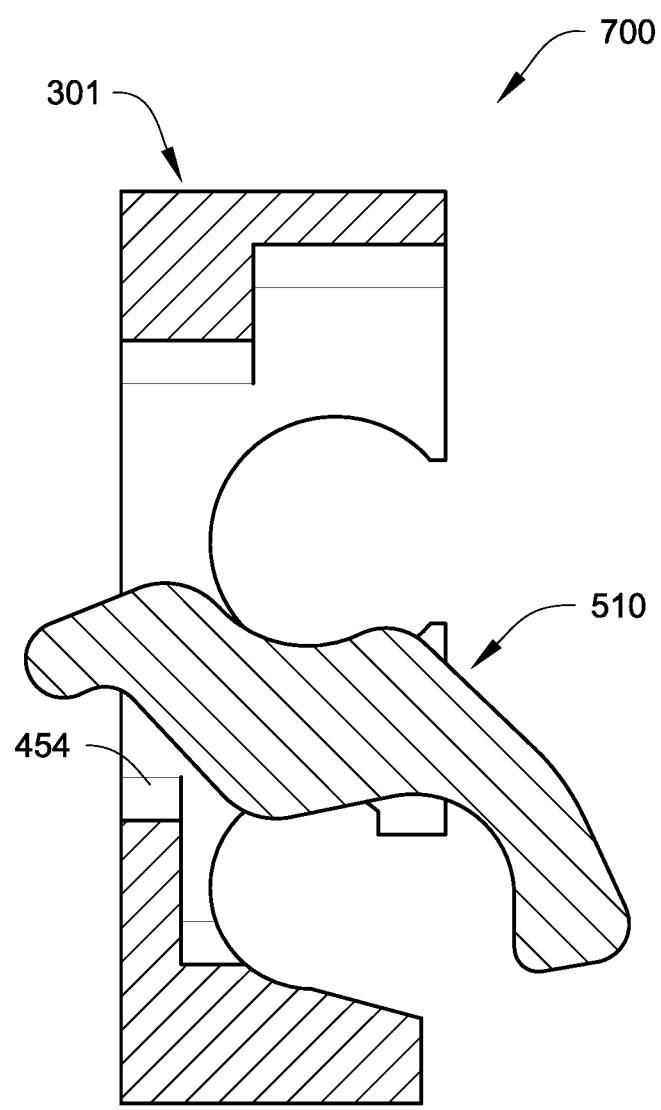
FIG. 7C is a cross-sectional view of the contactor assembly of FIG. 7A, according to one embodiment.

FIG. 7A is a cross-sectional view of a contactor assembly 700, according to one embodiment. FIG. 7B is a side view of the contactor assembly 700, according to one embodiment. FIG. 7C is a cross-sectional view of the contactor assembly 700, according to one embodiment.

The contactor assembly 700 includes a housing 301, a contact 510, and elastomers (not shown). The housing 301 is the same as the housing 300 of FIGS. 5A-6C, except that in housing 301, in the area 454 (similar to the area 450), there is no retainer 451. As such, as shown in FIG. 7A, when the sloped terminus 544 of the contact is engaged with the tail stop 382 of the first inner end wall 306 of the housing 301, the area 454 does not overlap with the contact 510, and clearance may exist between the inner side wall(s) of the housing 301 and the contact 510. As a results, in FIGS. 7B and 7C, elastomers (not shown) are disposed to bias the contact 510, but the contact 510 may rotate counter clockwise, especially when the contactor assembly 700 is removed from the load board.

Embodiments disclosed herein may improve contact retention capability, may be machined from the bottom/top of the housing, and may be low cost. With the embodiments disclosed herein, contact may be resting against the tail stop of the housing, the contact may be likely to roll properly when it is actuated, and the contact tail of the contact may be controlled and the rotation of the contact may be well controlled. It will be appreciated that in one embodiment, the retainer and the contact may be configured so that the retainer may function as an up-stop of the contact, especially when the contact assembly is not mounted (or removed from the load board).

The description of the invention and its applications as set forth herein is illustrative and is not intended to limit the scope of the invention. Variations and modifications of the embodiments disclosed herein are possible and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

Aspects

It is noted that any one of aspects below can be combined with each other.

Aspect 1. A contactor assembly for a testing system for testing integrated circuit devices, comprising:
 a contact having a contact head, a contact body, and a contact tail; and
 a housing having a first planar side surface and a second planar side surface opposite to the first surface,
 wherein the housing includes a top surface and a bottom surface opposite to the top surface, a slot extends through the housing from the top surface to the bottom surface, the slot defines a first inner side wall of the housing, a second inner side wall of the housing opposite to the first inner side wall, a first inner end wall of the housing, and a second inner end wall of the housing opposite to the first inner end wall;
 the contact is receivable in the slot, the contact tail includes a flat portion and a sloped terminus;
 a retainer is disposed on the first inner side wall of the housing;
 when the sloped terminus of the contact is engaged with the first inner end wall of the housing, at least a portion of the retainer overlaps with the contact forming at an overlapping area in a cross-sectional view, and no clearance exists between the retainer and the contact in at least a portion of the overlapping area.

Aspect 2. The contactor assembly according to aspect 1, wherein the housing includes a first hole and a second hole, the first hole and the second hole extend from the first planar side surface to the second planar side surface.

Aspect 3. The contactor assembly according to aspect 2, wherein the first hole and the second hole are essentially cylindrically shaped.

Aspect 4. The contactor assembly according to aspect 2 or aspect 3, further comprising:
 a first elastomer extending through the first hole; and
 a second elastomer extends through the second hole.

Aspect 5. The contactor assembly according to aspect 4, wherein the first elastomer and the second elastomer are essentially cylindrically shaped,
 the first elastomer and the second elastomer are non-conductive.

Aspect 6. The contactor assembly according to aspect 4 or aspect 5, wherein at least one of the first elastomer and the second elastomer is configured to bias the contact.

Aspect 7. The contactor assembly according to any one of aspects 2-6, wherein a size of the first hole is smaller than a size of the second hole.

Aspect 8. The contactor assembly according to any one of aspects 1-7, wherein a thickness of the slot is greater than a thickness of the contact.

Aspect 9. The contactor assembly according to any one of aspects 1-8, wherein the contact is conductive.

Aspect 10. The contactor assembly according to any one of aspects 1-9, wherein the retainer is a machined integral part of the housing.

Aspect 11. The contactor assembly according to any one of aspects 1-10, wherein the retainer is an insert attached to the first inner side wall of the housing.

Aspect 12. The contactor assembly according to any one of aspects 1-11, wherein the slot has a stadium shape in a top view.

Aspect 13. The contactor assembly according to any one of aspects 1-12, wherein the retainer extends in a direction from a first end of the slot towards a second end of the slot.

Aspect 14. The contactor assembly according to any one of aspects 1-13, wherein the retainer is curved in a direction a first end of the slot towards the first inner side wall of the housing.

Aspect 15. A testing system for testing integrated circuit devices, comprising:
 a device under test having at least one terminal; and
 a contactor assembly including:
  a contact having a contact head, a contact body, and a contact tail; and
  a housing having a first planar side surface and a second planar side surface opposite to the first surface;
  wherein the housing includes a top surface and a bottom surface opposite to the top surface, a slot extends through the housing from the top surface to the bottom surface, the slot defines a first inner side wall of the housing, a second inner side wall of the housing opposite to the first inner side wall, a first inner end wall of the housing, and a second inner end wall of the housing opposite to the first inner end wall;
  the contact is receivable in the slot, the contact tail includes a flat portion and a sloped terminus;
  a retainer is disposed on the first inner side wall of the housing;
  when the sloped terminus of the contact is engaged with the first inner end wall of the housing, at least a portion of the retainer overlaps with the contact forming at an overlapping area in a cross-sectional view, and no clearance exists between the retainer and the contact in at least a portion of the overlapping area,
 wherein the at least one terminal of the device under test is configured to engage with the contact head during testing.

Aspect 16. The testing system according to aspect 15, wherein the at least one terminal of the device under test is a pad.

Aspect 17. The testing system according to aspect 15, wherein the at least one terminal of the device under test is a pin.

Aspect 18. The testing system according to any one of aspects 15-17, further comprising a load board, a terminal of the load board is configured to engage with the flat portion of the contact tail during testing.

Aspect 19. The testing system according to aspect 18, wherein the terminal of the load board is a pad.

Aspect 20. A method of retaining a contact of a contactor assembly in a testing system for testing integrated circuit devices, in a contact housing of the contactor assembly wherein the contactor assembly includes the contact having a contact head, a contact body, and a contact tail; and the housing having a first planar side surface and a second planar side surface opposite to the first surface; wherein the housing includes a top surface and a bottom surface opposite to the top surface, a slot extends through the housing from the top surface to the bottom surface, the slot defines a first inner side wall of the housing, a second inner side wall of the housing opposite to the first inner side wall, a first inner end wall of the housing, and a second inner end wall of the housing opposite to the first inner end wall, the method comprising:

configuring the contact to be received in the slot, the contact tail including a flat portion and a sloped terminus;

locating a retainer on the first inner side wall of the housing;

engaging the sloped terminus of the contact with the first inner end wall of the housing;

forming an overlapping area between at least a portion of the retainer and the contact in a cross-sectional view; and retaining the contact in place when the contactor assembly is removed from a load board.

The terminology used in this specification is intended to describe particular embodiments and is not intended to be limiting. The terms "a," "an," and "the" include the plural forms as well, unless clearly indicated otherwise. The terms "comprises" and/or "comprising," when used in this specification, specify the presence of the stated features, integers, steps, operations, elements, and/or components, but do not preclude the presence or addition of one or more other features, integers, steps, operations, elements, and/or components.

With regard to the preceding description, it is to be understood that changes may be made in detail, especially in matters of the construction materials employed and the shape, size, and arrangement of parts without departing from the scope of the present disclosure. This specification and the embodiments described are exemplary only, with the true scope and spirit of the disclosure being indicated by the claims that follow.

What is claimed is:

1. A contactor assembly for a testing system for testing integrated circuit devices, comprising:

a contact having a contact head, a contact body, and a contact tail; and a housing having a first planar side surface and a second planar side surface opposite to the first surface, wherein the housing includes a top surface and a bottom surface opposite to the top surface, a slot extends through the housing from the top surface to the bottom surface, the slot defines a first inner side wall of the housing, a second inner side wall of the housing opposite to the first inner side wall, a first inner end wall of the housing, and a second inner end wall of the housing opposite to the first inner end wall;

the contact is receivable in the slot, the contact tail includes a flat portion and a sloped terminus;

a retainer is disposed on the first inner side wall of the housing;

when the sloped terminus of the contact is engaged with the first inner end wall of the housing, at least a portion of the retainer overlaps with the contact forming an overlapping area in a cross-sectional view, the retainer is configured to prevent the contact from rotating out of position in the housing.

2. The contactor assembly according to claim 1, wherein the housing includes a first hole and a second hole, the first hole and the second hole extend from the first planar side surface to the second planar side surface.

3. The contactor assembly according to claim 2, wherein the first hole and the second hole are essentially cylindrically shaped.

4. The contactor assembly according to claim 2, further comprising:

a first elastomer extending through the first hole; and a second elastomer extends through the second hole.

5. The contactor assembly according to claim 4, wherein the first elastomer and the second elastomer are essentially cylindrically shaped, the first elastomer and the second elastomer are non-conductive.

6. The contactor assembly according to claim 4, wherein at least one of the first elastomer and the second elastomer is configured to bias the contact.

7. The contactor assembly according to claim 2, wherein a size of the first hole is smaller than a size of the second hole.

8. The contactor assembly according to claim 1, wherein a thickness of the slot is greater than a thickness of the contact.

9. The contactor assembly according to claim 1, wherein the contact is conductive.

10. The contactor assembly according to claim 1, wherein the retainer is a machined integral part of the housing, or the retainer is an insert attached to the first inner side wall of the housing.

11. The contactor assembly according to claim 1, wherein the slot has a stadium shape in a top view.

12. The contactor assembly according to claim 1, wherein the retainer extends in a direction from a first end of the slot towards a second end of the slot.

13. The contactor assembly according to claim 1, wherein the retainer is curved in a direction a first end of the slot towards the first inner side wall of the housing.

14. A testing system for testing integrated circuit devices, comprising:

a device under test having at least one terminal; and a contactor assembly including:

a contact having a contact head, a contact body, and a contact tail; and a housing having a first planar side surface and a second planar side surface opposite to the first surface;

wherein the housing includes a top surface and a bottom surface opposite to the top surface, a slot extends through the housing from the top surface to the bottom surface, the slot defines a first inner side wall of the housing, a second inner side wall of the housing opposite to the first inner side wall, a first inner end wall of the housing, and a second inner end wall of the housing opposite to the first inner end wall;

the contact is receivable in the slot, the contact tail includes a flat portion and a sloped terminus;

a retainer is disposed on the first inner side wall of the housing;

when the sloped terminus of the contact is engaged with the first inner end wall of the housing, at least a portion of the retainer overlaps with the contact forming an overlapping area in a cross-sectional view, the retainer is configured to prevent the contact from rotating out of position in the housing, wherein the at least one terminal of the device under test is configured to engage with the contact head during testing.

15. The testing system according to claim 14, wherein the at least one terminal of the device under test is a pad or a pin.

16. The testing system according to claim 14, further comprising a load board, a terminal of the load board is configured to engage with the flat portion of the contact tail during testing.

17. The testing system according to claim 16, wherein the terminal of the load board is a pad.

18. A method of retaining a contact of a contactor assembly in a testing system for testing integrated circuit devices, in a contact housing of the contactor assembly wherein the contactor assembly includes the contact having a contact head, a contact body, and a contact tail; and the housing having a first planar side surface and a second planar side surface opposite to the first surface; wherein the housing includes a top surface and a bottom surface opposite to the top surface, a slot extends through the housing from the top surface to the bottom surface, the slot defines a first inner side wall of the housing, a second inner side wall of the housing opposite to the first inner side wall, a first inner end wall of the housing, and a second inner end wall of the housing opposite to the first inner end wall, the method comprising:

configuring the contact to be received in the slot, the contact tail including a flat portion and a sloped terminus;

locating a retainer on the first inner side wall of the housing;

engaging the sloped terminus of the contact with the first inner end wall of the housing;

forming an overlapping area between at least a portion of the retainer and the contact in a cross-sectional view; and the retainer retaining the contact in place when the contactor assembly is removed from a load board.

19. The contactor assembly according to claim 1, wherein no clearance exists between the retainer and the contact in at least a portion of the overlapping area.

20. The contactor assembly according to claim 1, wherein at the overlapping area, the retainer has a thickness to touch the contact to retain the contact in place.

* * * * *